(12) United States Patent
Rattan

(10) Patent No.: US 10,784,887 B2
(45) Date of Patent: Sep. 22, 2020

(54) VOLTAGE-SIGNAL GENERATION

(71) Applicant: SOCIONEXT INC., Kanagawa (JP)

(72) Inventor: Suhas Rattan, Reading (GB)

(73) Assignee: SOCIONEXT INC., Kanagawa (JP)

( * ) Notice: Subject to any disclaimer, the term of this patent is extended or adjusted under 35 U.S.C. 154(b) by 0 days.

(21) Appl. No.: 16/719,741

(22) Filed: Dec. 18, 2019

(65) Prior Publication Data

US 2020/0204190 A1 Jun. 25, 2020

(30) Foreign Application Priority Data

Dec. 19, 2018 (EP) .................................... 18214274

(51) Int. Cl.
| | |
|---|---|
| *H03M 1/78* | (2006.01) |
| *H03M 1/38* | (2006.01) |
| *H03M 1/06* | (2006.01) |
| *H03M 1/80* | (2006.01) |
| *H03M 1/12* | (2006.01) |
| *H03M 1/00* | (2006.01) |

(52) U.S. Cl.
CPC .......... *H03M 1/78* (2013.01); *H03M 1/0646* (2013.01); *H03M 1/38* (2013.01); *H03M 1/00* (2013.01); *H03M 1/001* (2013.01); *H03M 1/12* (2013.01); *H03M 1/804* (2013.01)

(58) Field of Classification Search
CPC ........ H03M 1/0646; H03M 1/12; H03M 1/00; H03M 1/804; H03M 1/001
USPC .................. 341/154, 155, 158, 172, 110, 122
See application file for complete search history.

(56) References Cited

U.S. PATENT DOCUMENTS

| | | | |
|---|---|---|---|
| 5,638,072 A | 6/1997 | Van Auken et al. | |
| 8,049,654 B2 | 11/2011 | Reinhold et al. | |

(Continued)

FOREIGN PATENT DOCUMENTS

| | | |
|---|---|---|
| CN | 101977058 B | 4/2013 |
| EP | 2211468 A1 | 7/2010 |

OTHER PUBLICATIONS

Extended European Search Report issued in corresponding European Patent Application No. 18214274.5, dated Jul. 4, 2019.

(Continued)

*Primary Examiner* — Joseph J Lauture
(74) *Attorney, Agent, or Firm* — McDermott Will & Emery LLP

(57) ABSTRACT

Controllable voltage-signal generation circuitry, including: a plurality of segment nodes connected together in series, each adjacent pair of segment nodes connected together via a corresponding coupling capacitor, an end one of the segment nodes serving as an output node; for each of the segment nodes, at least one segment capacitor having a first terminal connected to that segment node and a second terminal connected to a corresponding switch; and switch control circuitry, wherein: each switch is operable to connect the second terminal to one reference voltage source and then instead to another reference voltage source, to apply a voltage change at the second terminal; the reference voltage sources and switches configured such that for each segment node the same voltage change in magnitude is applied by each switch, and such that the voltage change is different in magnitude from the voltage change applied by each switch of another segment node.

18 Claims, 15 Drawing Sheets

(56) References Cited

U.S. PATENT DOCUMENTS

| | | |
|---|---|---|
| 8,446,304 B2 | 5/2013 | Scanlan |
| 8,659,459 B2 | 2/2014 | Kim et al. |
| 2010/0079327 A1* | 4/2010 | Berens ............... H03M 1/0682 341/158 |
| 2010/0214140 A1 | 8/2010 | Reinhold et al. |
| 2012/0001781 A1 | 1/2012 | Scanlan |
| 2012/0081243 A1 | 4/2012 | Kim et al. |

OTHER PUBLICATIONS

Yan Zhu et al., "A Voltage Feedback Charge Compensation Technique for Split DAC Architecture in SAR ADCs," IEEE International Symposium on Circuits and Systems, 2001, pp. 4061-4064.

* cited by examiner

Fig. 5B

| Operation | | Relative C | ΔV (*Vref) | Relative Weight |
|---|---|---|---|---|
| (MSB) | B1 | 32 | 0.5 | 16 |
| | B2 | 16 | 0.5 | 8 |
| | B3 | 8 | 0.5 | 4 |
| | B4 | 4 | 0.5 | 2 |
| | B5 | 2 | 0.5 | 1 |
| (LSB) | B6 | 1 | 0.5 | 0.5 |

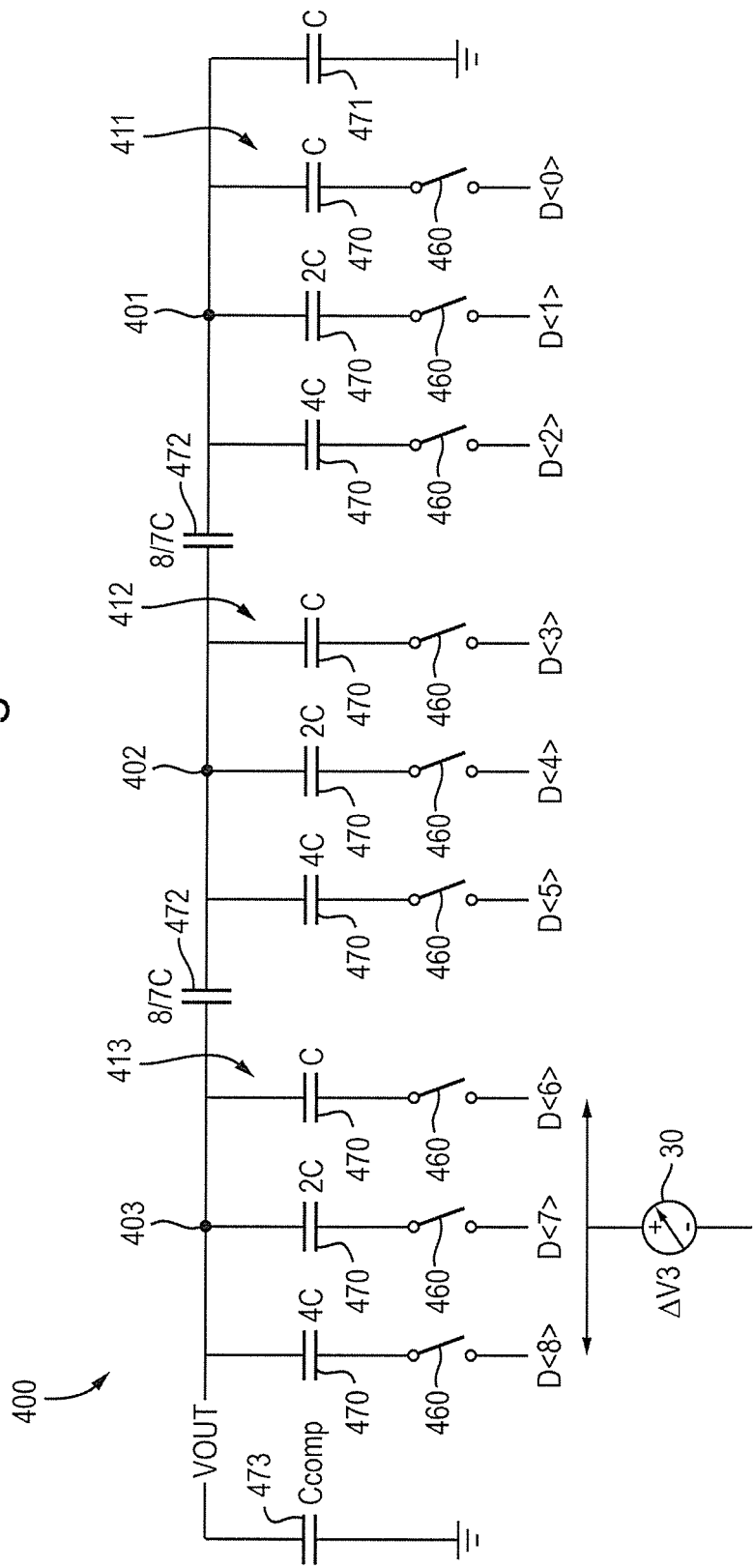

VOLTAGE-SIGNAL GENERATION

CROSS-REFERENCE TO RELATED APPLICATIONS

The present application claims priority under 35 U.S.C. § 119 to European Patent Application No. 18214274.5 filed on Dec. 19, 2018. The above application is hereby expressly incorporated by reference, in its entirety, into the present application.

The present invention relates to voltage-signal generation circuitry, in particular to controllable voltage-signal generation circuitry. Such circuitry may serve as or form part of digital-to-analogue converter (DAC) circuitry (whose output voltage signal may be controllable based on an input digital signal). The DAC circuitry could for example be implemented in a successive approximation register analogue-to-digital converter (SAR ADC).

A SAR ADC is circuitry configured to use successive approximation to arrive at a multi-bit digital value representative of an analogue input value. A SAR ADC typically uses a comparator in each of its successive approximation (sub-conversion) operations. Successive-approximation conversion may be considered as one example of a conversion process which is made up of a sequence of such sub-conversion operations. Such ADC circuitry (mixed-signal circuitry) may have particular use, for example, as the ADC circuitry (sub-ADC units) used at the ends of the paths in the sampling circuitry disclosed in EP-A1-2211468.

As background, therefore, to explore merely one potential application of circuitry of the present invention, aspects of the sampling circuitry disclosed in EP-A1-2211468 will now be considered.

FIG. 1 is a schematic diagram of overall analogue-to-digital circuitry 40, to which the present invention may be applied. Circuitry 40 comprises sampler 42, voltage-controlled oscillator (VCO) 44 as an example clock-signal generator, demultiplexers 46, ADC banks 48, digital unit 50 and calibration unit 52. It will become apparent that actual successive-approximation conversion takes place in the sub-ADC units (or ADC sub-units) of the ADC banks 48, and thus focus will be placed on these banks and their configuration later herein.

The sampler 42 is configured to perform four-way or four-phase time-interleaving so as to split the input current $I_{IN}$ by current steering into four time-interleaved sample streams A to D. For this purpose, VCO 44 is a quadrature VCO operable to output four clock signals 90° out of phase with one another, for example as four raised cosine signals. VCO 44 may for example be a shared 16 GHz quadrature VCO to enable circuitry 40 to have an overall sample rate of 64 GS/s.

Each of streams A to D comprises a demultiplexer 46 and an ADC bank 48 connected together in series as shown in FIG. 1. The sampler 42 operates in the current mode and, accordingly, streams A to D are effectively four time-interleaved streams of current pulses originating from (and together making up) input current $I_{IN}$, each stream having a sample rate one quarter of the overall sample rate. Continuing the example overall sample rate of 64 GS/s, each of the streams A to D may have a 16 GS/s sample rate.

Focusing on stream A by way of example, the stream of current pulses is first demultiplexed by an n-way demultiplexer 46. Demultiplexer 46 is a current-steering demultiplexer and this performs a similar function to sampler 42, splitting stream A into n time-interleaved streams.

The n streams output from demultiplexer 46 pass into ADC bank 48, which contains n ADC sub-units each operable to convert its incoming pulse stream into digital signals, for example into 8-bit digital values. Accordingly, n digital streams pass from ADC bank 48 to digital unit 50.

Streams B, C, and D operate analogously to stream A, and accordingly duplicate description is omitted. If n=80, circuitry 40 may be considered to comprise 320 ADC sub-units split between the four ADC banks 48.

Calibration unit 52 is connected to receive a signal or signals from the digital unit 50 and, based on that signal, to determine control signals to be applied to one or more of the sampler 42, VCO 44, demultiplexers 46 and ADC banks 48.

FIG. 2 is a schematic diagram useful for understanding the principle of operation of ADC banks 48. For simplicity, only one output 60 of the demultiplexers 46 is shown, and consequently the ADC circuitry 48 shown represents only the ADC circuitry (sub-ADC unit) required for that particular output. Similar ADC circuitry 48 (sub-ADC units) may be provided for all the outputs of the demultiplexers 46.

ADC circuitry 48 generally takes the form of a capacitance 150. As shown in FIG. 2, capacitance 150 may be variable in value, such that its value can be trimmed during calibration or during an initial setup phase. Generally speaking, capacitance 150 is employed to convert the current pulses from output 60 into voltage values $V_{OUT}$. That is, each pulse charges up capacitance 150 to a voltage proportional to the area of the pulse concerned. This is because the amount of charge in each current pulse is defined by its area (Q=∫I dt), and because the voltage across the capacitance 150 is defined by that amount of charge Q and the capacitance value C (V=Q/C).

The voltage Vow' for a particular pulse is held across capacitance 150 until the circuitry 48 is reset by reset switch 152. Whilst the voltage $V_{OUT}$ for a particular pulse is held, this analog output value can be converted into a digital output value, for example using an ADC circuit employing a successive-approximation register (SAR). In the case of differential circuitry, as may be the case for the FIG. 1 circuitry although not explicitly shown, each $V_{OUT}$ will have its complementary $V_{OUT}$, and the pair may be applied together to a differential comparator so that a single digital output for that pair is output.

An advantage of this mode of operation is that even if delays are experienced within the demultiplexers 46, the charge in each pulse will still make it to the relevant outputs, albeit over a slightly longer period. In that case, the voltage $V_{OUT}$ produced from the pulse remains unaffected. To illustrate this point, two examples 154 and 156 of the same current pulse are shown in FIG. 2. The first pulse 154 represents a case in which minimal delay is experienced. The second pulse 156 represents a case in which some delay/spreading is experienced, for example due to track capacitance in the circuitry. Consequently, pulse 156 is stretched in time as compared to pulse 154. Importantly, the area of the two pulses 154 and 156 is substantially the same, and thus the output voltage $V_{OUT}$ would be the same for both.

FIG. 3 is a schematic diagram useful for understanding a possible application of SAR-ADC (Successive Approximation Register-Analogue-to-Digital Conversion) circuitry within each sub-ADC unit of the circuitry 48 in FIG. 1. Such circuitry could have a cycle of sub-conversion operations (phases/steps) of the form: Reset (R); Sample (S); 1; 2; 3; 4; 5; 6; 7 and 8, as shown in FIG. 3. In each Sample sub-conversion operation, a current pulse concerned may be converted into an output voltage $V_{OUT}$, and subsequently that voltage $V_{OUT}$ may be turned into an 8-bit digital value over the following 8 SAR sub-conversion operations. The next Reset sub-conversion operation then prepares the circuitry for the next current pulse.

FIG. 4 presents example SAR ADC circuitry which may be employed with the circuitry of FIGS. 1 and 2, i.e. as part of the sub-ADC units of the ADC banks 48, merely by way of further introduction to the general concept or SAR conversion. The main elements are an S/H (Sample/Hold—or sampler) circuit 170 to acquire $V_{OUT}$ from FIG. 2, a voltage comparator 180, an internal DAC 190 and an SAR 200. It will be appreciated that the arrangement of elements in FIG. 2 is a simple example to aid in an overview understanding of the functionality of SAR ADC circuitry. However, in other arrangements (where e.g. charge-redistribution techniques are used, with the DAC 190 being a capacitive DAC or CDAC), some of the functionality of the elements (e.g. the S/H 170) may be provided as part of the functionality of another element (e.g. the DAC 190).

Continuing with FIG. 4, the comparator 180 compares the held $V_{OUT}$ with the output of the internal DAC 190 and outputs the result of the comparison to the SAR 200. The SAR 200 is designed to supply a digital code approximating to the internal DAC 190. The DAC 190 supplies the comparator with an analogue voltage based upon the digital code input from the SAR 200.

The SAR 200 is initialised so that its MSB is equal to digital 1 (the other bits being digital 0). This code is then input to DAC 190, whose output analogue voltage is supplied to comparator 180. If this analogue voltage is greater than $V_{OUT}$ the comparator 180 causes SAR 200 to reset this bit; otherwise, the bit is kept as a 1. Then, the next bit is set to 1 and the same procedure (sub-conversion operation) is followed, continuing this binary search until every bit in the SAR 200 has been tested (these "tests" corresponding respectively to sub-conversion operations 1 to 8 in FIG. 3). The resulting digital code output from the SAR 200 is the digital approximation of the sample voltage $V_{OUT}$ and is finally output when the conversion is complete.

It will be apparent that each such "test" involves a comparison operation performed by the comparator. Typically, such sub-conversion operations are carried out synchronously, i.e. with each sub-conversion operation taking the same amount of time as regulated by a clock signal. This may mean that each sub-conversion has a "compare" period during which the necessary comparison is carried out, and at the end of which the result of the comparison is delivered to the surrounding circuitry. This "compare" period may then be followed by a "reset" period in which the comparator is readied for the next comparison, i.e. the next sub-conversion operation. However, asynchronous control is also envisaged, where each successive sub-conversion operation is triggered by the completion of the preceding sub-conversion operation (effectively, by an asynchronous clock signal).

Continuing the general successive-approximation technique discussed in connection with FIG. 4, FIG. 5A is a schematic diagram of example SAR ADC circuitry 300 considered by the present inventors.

The ADC circuitry 300 comprises an analogue input terminal 310, a comparator 320 and successive-approximation control circuitry (which may be referred to simply as successive-approximation circuitry) 330. Also shown is a voltage reference source 380 which may be considered part of the successive-approximation control circuitry or generally part of the SAR ADC circuitry 300.

The analogue input terminal 310 is connected to receive an analogue input voltage signal $V_{IN}$ (which may correspond to a charge pulse taken from an input control signal in line with FIGS. 1 and 2). Thus, $V_{IN}$ in FIG. 5A may correspond to $V_{OUT}$ in FIGS. 2 and 4.

The comparator 320 has first and second comparator-input terminals 322 and 324 and a comparator-output terminal 326, and is operable to generate a comparison result (e.g. a logic 1 or 0) at its comparator-output terminal 326 based on a potential difference applied across the comparator-input terminals 322 and 324. The successive-approximation control circuitry 330 is configured to apply a potential difference across the first and second input terminals 322 and 324 based upon the input voltage signal $V_{IN}$ during the sample phase, and configured to control the potential difference for each of a series of successive-approximation operations through charge redistribution as will become apparent, the control applied in each successive-approximation operation being dependent on a comparison result generated by the comparator 320 in the preceding approximation operation.

As shown in FIG. 5A, the successive-approximation control circuitry 330 comprises a SAR control unit 340, a charge reset switch 350, a plurality of capacitor switches 360 and a corresponding plurality of capacitors 370, and an end capacitor 371. The capacitors 370 have first and second capacitor terminals, their first terminals being connected to one of the comparator-input terminals 322 and 324, in this case terminal 324, and their second terminals being connected via respective capacitor switches 360 to the voltage reference source 380. Although not shown in detail to avoid over-complication, it will be understood that each capacitor switch 360 is operable to connect the second terminal of its capacitor 370 to either a $V_{ref}$ voltage supply, a GND voltage supply (i.e. 0V) or a $v_{mid}$ voltage supply being halfway in voltage level between the $V_{ref}$ and GND voltage levels, such that $V_{mid}=V_{ref}/2$. The charge reset switch 350 is connected in common to the first terminals of the capacitors 370 and is operable to connect them to e.g. the GND voltage supply (or, in general, some other voltage $V_1$) effectively to reset the amount of charge stored on the capacitors 370 to a reset or initial amount.

As also shown in FIG. 5A, the SAR control unit 340 is connected to be controlled by the comparison result output from the comparator-output terminal 326 and is configured to control the charge reset switch 350 and the capacitor switches 360 by way of a control signal 342. Although not shown in FIG. 5A, the SAR control unit 340 outputs the eventual digital output value representative of $V_{IN}$. The capacitors 370 in FIG. 5A may have for example relative capacitance values 32C, 16C, 8C, 4C, 2C, C from top to bottom, so that their contribution to storing charge (absent any differences between the voltage differences across them) is weighted, in this case using a binary weighting system. The end capacitor 371 has its first terminal connected to comparator-input terminal 324 and its second terminal connected to GND. In this example the end capacitor has a capacitance value C, such that the total capacitance value (i.e. the sum of the capacitances of the capacitors 370 and the capacitor 371) is 64C, or twice the largest capacitance value of the capacitors 370, 32C. In other examples the capacitors 370 and 371 could have other capacitance values, and the successive-approximation control circuitry 330 may not comprise the end capacitor 371. The end capacitor 371 may be considered optional—removing it simply changes where the step boundaries are (i.e. the voltage steps caused by controlling the switches 360).

Successive-approximation control circuitry 330 may instead use a non-binary weighting system. For example the capacitors 370 may be given example relative capacitance values 29C, 16C, 9C, 5C, 3C, 2C from top to bottom in FIG. 5A. Such an example could be considered where the successive-approximation control circuitry 330 employs these relative capacitance values and does not include the capacitor 371. In such an example, the capacitors' 370 contribution to storing charge (absent any differences between the voltage differences across them) would be weighted using a non-binary weighting system. That is, 16C is bigger than half of 29C, 9C is bigger than half of 16C, 5C is bigger than half of 9C and so on and so forth. An advantage of using a non-binary weighting system is that certain errors in the conversion process (e.g. due to the comparator not settling correctly in time) can be tolerated, and ultimately corrected for.

The FIG. 5A binary-weighted example will now be considered further.

In operation, to convert a given analogue input voltage signal $V_{IN}$ into a representative digital output value, the input voltage signal $V_{IN}$ is applied to the comparator-input terminal 322 as shown, the capacitor switches 360 are all controlled to connect the second terminals of their capacitors 370 to $V_{mid}$, and the charge reset switch 350 is closed to reset the amount of charge stored on the capacitors 370 to an initial amount as mentioned above. In this state, the capacitors 370 all have the same potential difference across them, and thus the charge stored on them is weighted by their relative capacitance values. The charge reset switch 350 is then opened (with the capacitor switches left in their existing state) and the amount of charge on the capacitors 370 is then effectively held with the potential difference between the comparator—input terminals 322 and 324 dependent on $V_{IN}$ (and, indeed, equal to $V_{IN}-V_1$). This is the "start" state.

The successive-approximation operations then proceed one-by-one, each operation controlling a successive one of the capacitors 370 from the top (largest relative capacitance) to the bottom in FIG. 5A. For convenience of explanation, the capacitors 370 and capacitor switches 360 will be numbered B1 to B6 from the top to the bottom in FIG. 5A, as effectively corresponding to the first to sixth bits (from MSB to LSB) of the eventual (raw) digital output value. The successive operations will also be numbered B1 to B6 for similar reasons. Of course, the top-to-bottom ordering is schematic.

Thus, firstly in the B1 operation, the comparator 320 outputs a comparison result in the start state. If the result is negative (logic 0), the B1 capacitor switch 360 is switched to GND to cause a $-\frac{1}{2}V_{ref}$ voltage change at the second terminal of the B1 capacitor 370, and the B1 bit of the raw digital output value is assigned value 0. If, however, the result is positive (logic 1), the B1 capacitor switch 360 is switched to $V_{ref}$ to cause a $+\frac{1}{2}V_{ref}$ voltage change at the second terminal of the B1 capacitor 370, and the B1 bit of the raw digital output value is assigned value 1. Either way, the switching of the B1 capacitor switch 370 causes the (fixed) total amount of charge stored on the capacitors 370 to be redistributed and the voltage level at the comparator-input terminal 324 (and thus the potential difference between the comparator-input terminals 322 and 324) to change accordingly. For the avoidance of doubt, the B2 to B6 capacitor switches 360 are not switched in this operation, and this general idea applies mutatis mutandis to the further operations. The next operation can then begin.

In the B2 operation, the comparator outputs a comparison result in the existing state. If the result is negative (logic 0), the B2 capacitor switch 360 is switched to GND to cause a $-\frac{1}{2}V_{ref}$ voltage change at the second terminal of the B2 capacitor 370, and the B2 bit of the raw digital output value is assigned value 0. If, however, the result is positive (logic 1), the B2 capacitor switch 360 is switched to $V_{ref}$ to cause a $\frac{1}{2}V_{ref}$ voltage change at the second terminal of the B2 capacitor 370, and the B2 bit of the raw digital output value is assigned value 1. Again, the switching of the B2 capacitor switch 370 causes the charge stored on the capacitors 370 to be redistributed. The next operation can then begin.

In the B3 operation, the comparator outputs a comparison result in the existing state. If the result is negative (logic 0), the B3 capacitor switch 360 is switched to GND to cause a $-\frac{1}{2}V_{ref}$ voltage change at the second terminal of the B3 capacitor 370, and the B3 bit of the raw digital output value is assigned value 0. If, however, the result is positive (logic 1), the B3 capacitor switch 360 is switched to $V_{ref}$ to cause a $+\frac{1}{2}V_{ref}$ voltage change at the second terminal of the B3 capacitor 370, and the B3 bit of the raw digital output value is assigned value 1. Again, the switching of the B3 capacitor switch 360 causes the charge stored on the capacitors 370 to be redistributed.

The B4 to B6 operations continue one after the other in the same manner, and duplicate description can be omitted. At the end of the B1 to B6 operations, a final comparison can be carried out which may give a 7th bit (i.e. B7) and thus the raw digital output value, e.g. 1011011, is produced. This value is referred to as a "raw" value since there may be some subsequent "correction" of this result in the SAR control unit 340 (or in other circuitry such as a processor connected thereto and not shown in FIG. 5), in the example in which successive-approximation control circuitry 330 uses a non-binary weighting system as mentioned above to lead to a "corrected" digital output value.

It will be noticed that in each of the B1 to B6 operations, there is a change in voltage level $\Delta V$ of $\frac{1}{2}V_{ref}$ at the second terminal of the capacitor 370 for that operation. Thus, in charge terms, there could be considered to be a relative weighting between the operations B1 to B6 set by $\Delta V$ for that operation multiplied by the relative capacitance of the capacitor for that operation, ranging from 16 for B1 down to 0.5 for B6 as indicated in FIG. 5B. The operation B1 has been labelled in FIG. 5B with MSB (most significant bit) and the operation B6 has been labelled in FIG. 5B with the label LSB (least significant bit), to aid in understanding. These weights make for a binary weighting system as discussed above. Of course, a non-binary weighting system could be applied in FIG. 5A with non-binary weighted relative capacitance values (as mentioned above), with the benefit of correction afforded by the non-binary weighting system. Here, "non-binary" may be considered to mean that each (or at least one) successive value is more than half the previous one from successive operation to operation, so that the ratio R of the values (e.g. 29C/16C in capacitance values, or more importantly 14.5/8 in relative weights) satisfies 1<R<2 (more generally, R≠2 or R<2).

The voltage reference source 380 of the successive-approximation control circuitry 330 described above outputs $V_{ref}$, $V_{mid}$ ($V_{ref}/2$) and GND (ground). However, successive-approximation control circuitry 330 can also be operated in a different way in which the switches 360 are configured to connect the second terminals of the capacitors 370 to either GND or a reference voltage (e.g. $V_{ref}$) (and also to the analogue input voltage signal $V_{IN}$ in an initial phase). That is, such successive-approximation control circuitry 330 is operated by first connecting the second terminals of all the capacitors 370 to the analogue input voltage signal $V_{IN}$ with the charge reset switch 350 closed, then the charge reset switch 350 is opened and the second terminals of all the capacitors 370 are disconnected from the analogue input voltage signal $V_{IN}$, thus effectively trapping a charge proportional to the input voltage in the capacitors 370. The second terminals of all the capacitors 370 are then connected to GND, driving the potential at the comparator-input terminal 324 to $-V_{IN}$. In this case, the comparator-input terminal 322 is connected to GND. Thus the potential difference between the comparator-input terminals 322 and 324 is 0 (ideally).

In the B1 operation in this implementation, the B1 capacitor switch 360 is switched to $V_{ref}$. In the binary weighting system (for example the one described above with reference to FIG. 7B), the potential at the comparator-input terminal 324 is shifted in the positive direction by an amount equal to $\frac{1}{2} V_{ref}$. The comparator 320 outputs a comparison result. If the result is negative (logic 0), the B1 capacitor switch 360 is switched to GND and the B1 bit of the raw digital output value is assigned value 0. If, however, the result is positive (logic 1), the B1 capacitor switch 360 is not switched (that is, is stays connected to $V_{ref}$) and the B1 bit of the raw digital output value is assigned value 1.

In the B2 operation in this implementation, the B2 capacitor switch 360 is switched to $V_{ref}$ and the comparator outputs a comparison result. Again, if the result is negative (logic 0), the B2 capacitor switch 360 is switched to GND and the B2 bit of the raw digital output value is assigned value 0, and if, however, the result is positive (logic 1), the B2 capacitor switch 360 is not switched (that is, is stays connected to $V_{ref}$) and the B2 bit of the raw digital output value is assigned value 1.

The B3 to B6 operations in this implementation continue one after the other in the same manner and duplicate description can be omitted. At the end of the B1 to B6 operations in this implementation, a final comparison can be carried out which may give a 7th bit (i.e. B7) and thus the raw digital output value, e.g. 1011011, is produced. Of course, in this implementation, instead of being connected to ground GND, another reference voltage could be used.

Thus it is readily apparent that each switch 360 may be configured to switch between $V_{ref}$, $V_{mid}$ and GND, or between $V_{ref}$, GND and $V_{IN}$, depending on how the successive-approximation control circuitry 330 is to be operated.

Looking at FIG. 5A, the array of capacitors 370 and capacitor switches 360 may be referred to as a CDAC (capacitive DAC).

Unfortunately, existing CDAC-based SAR ADC circuitry such as circuitry 300 of FIG. 5A comes with an area penalty as the resolution of the CDAC is increased. Segmentation may be adopted to bring the area down, however segmentation of the CDAC leads to non-linearity problems as explained later.

According to an embodiment of a first aspect of the present invention, there is provided controllable voltage-signal generation circuitry, comprising: a plurality of segment nodes connected together in series, each adjacent pair of segment nodes in the series connection being connected together via a corresponding coupling capacitor, an end one of the segment nodes in the series connection serving as (or being) an output node; for each of the segment nodes, at least one segment capacitor having first and second terminals, the first terminal connected to that segment node and the second terminal connected to a corresponding switch; and switch control circuitry, wherein: each switch is operable to connect the second terminal of its segment capacitor to one reference voltage source and then instead to another reference voltage source, those reference voltage sources having different voltage levels, to apply a voltage change at the second terminal of its segment capacitor; the reference voltage sources and switches are configured such that for each segment node the same voltage change in magnitude is applied by each switch of that segment node, and such that the voltage change applied by each switch of one segment node is different in magnitude from the voltage change applied by each switch of another segment node; and the switch control circuitry is configured to control the switches so as to control a voltage signal at said output node.

Such circuitry enables a voltage signal to be generated based on the control of the switches. Such circuitry enables accurate control of the output voltage signal to be achieved in the sense that parasitic capacitances in the circuitry may be compensated for by setting the voltage changes appropriately (i.e. different from other voltage changes in some cases).

Such circuitry also enables accurate control of the output voltage signal to be achieved with fewer and/or smaller capacitors, in comparison to a case in which one or more banks of capacitors are used to compensate for parasitic capacitances in the circuitry. Since such banks of capacitors may not be required, a reduction in area of the circuitry may be achieved. A voltage change in the sense that it is used above may be readily adjusted, so the controllable voltage-signal generation circuitry makes it easier to compensate for parasitic capacitances by calibration (for example performed during an initial start-up phase, or during operation), especially since such parasitic capacitances may be incorrectly estimated during circuit design.

Such circuitry also enables accurate control of the output voltage signal to be achieved with fewer practical restrictions on the coupling capacitors, since the voltage change applied by each switch of one segment node is different in magnitude from the voltage change applied by each switch of another segment node. That is, the voltage changes may be set so that the restrictions on the values of the coupling capacitors may be relaxed.

The controllable voltage-signal generation circuitry may be implemented within or considered to be a CDAC, which may further be implemented within a SAR ADC, as disclosed herein. That is, the switches may be controlled based on a digital signal (an input word or code).

The plurality of segment nodes may comprise at least three segment nodes. For each of the segment nodes, at least two or three said segment capacitors may be connected at their first terminals to that segment node and at their second terminals to corresponding said switches, the capacitances of those segment capacitors optionally being binary-weighted relative to one another. The capacitances may be binary-weighted relative to one another in the sense that they follow a binary weighting system as described above with reference to FIGS. 5A and 5B.

The plurality of segment nodes may comprise at least three segment nodes. The reference voltage sources and switches may be configured such that, for at least three said segment nodes, the voltage change applied by each switch of any one of those segment nodes is different in magnitude from the voltage change applied by each switch of the other segment nodes of those segment nodes. That is, for at least three segment nodes, the corresponding voltage changes may be different one another. The voltage changes may be set to compensate for parasitic capacitances in the circuitry, and/or to relax the requirements on the coupling capacitors, for example.

At least one of said reference voltage sources may be a variable reference voltage source configured to be adjusted to adjust the voltage change applied by each switch connected to that reference voltage source. The voltage change or changes concerned may thereby be adjusted during operation or in an initial start-up phase of the circuitry.

At least one said reference voltage source connected to each switch may be a variable reference voltage source configured to be adjusted to adjust the voltage change applied by each switch concerned.

The controllable voltage-signal generation circuitry may comprise calibration circuitry configured to adjust the voltage level of at least one of the reference voltage sources.

Calibration may be performed during operation or in an initial start-up phase of the controllable voltage-signal generation circuitry. Such calibration may be performed in order to compensate for parasitic capacitances in the circuitry, and/or to relax the requirements on the coupling capacitors, for example.

The calibration circuitry may be configured to adjust the voltage level of at least one of the reference voltage sources connected to each switch for the segment node serving as (or being) the output node so as to adjust the voltage change applied by each switch of that segment node.

The calibration circuitry may be configured to adjust the voltage change applied by each switch of the segment node serving as the output node to calibrate out a gain error of the controllable voltage-signal generation circuitry (or to set the correct gain of, or control the gain of, the controllable voltage-signal generation circuitry).

The calibration circuitry may be configured to adjust the voltage level of at least one of the reference voltage sources connected to each switch for at least one segment node other than the segment node serving as the output node so as to adjust the voltage change applied by each switch of that segment node.

The calibration circuitry may be configured to adjust the voltage change applied by each switch of at least one segment node other than the segment node serving as the output node together with (i.e. by the same amount as) the voltage change applied by each switch of the segment node serving as the output node to calibrate out a gain error of the controllable voltage-signal generation circuitry (or to set the correct gain of, or control the gain of, the controllable voltage-signal generation circuitry).

The calibration circuitry may be configured to adjust the voltage change applied by each switch of each segment node other than the segment node serving as the output node together with (i.e. by the same amount as) the voltage change applied by each switch of the segment node serving as the output node to calibrate out a gain error of the controllable voltage-signal generation circuitry (or to set the correct gain of, or control the gain of, the controllable voltage-signal generation circuitry).

The reference voltage sources may be connected to the switches such that adjusting the voltage level of said at least one of the reference voltage sources connected to each switch for said at least one segment node other than the segment node serving as the output node adjusts the voltage change applied by each switch of that segment node:
  independently of the voltage change applied by each switch of each other segment node;
  and/or relative to the voltage change applied by each switch of the segment node serving as the output node.

The calibration circuitry may be configured to adjust the voltage change applied by each switch of at least one segment node other than the segment node serving as the output node to calibrate out non-linearity errors caused by the controllable voltage-signal generation circuitry.

The calibration circuitry may be configured to adjust the voltage change applied by each switch of at least one segment node other than the segment node serving as the output node to adjust a weighting of the effect of the voltage changes for that segment node relative to a weighting of the effect of the voltage changes for another said segment node.

The controllable voltage-signal generation circuitry may be a CDAC, the switch control circuitry configured to control the switches in dependence upon a digital signal; and/or for each segment node, that segment node, the connected at least one segment capacitor and corresponding switch, and a corresponding part of the switch control circuitry for controlling each of those switches may constitute a CDAC, the switch control circuitry configured to control those switches in dependence upon a digital signal. In this case, each segment capacitor may correspond to a bit of the digital signal (the input word or code).

According to an embodiment of a second aspect of the present invention, there is provided digital-to-analogue converter circuitry or analogue-to-digital converter circuitry comprising the controllable voltage-signal generation circuitry of the aforementioned first aspect of the present invention.

In the case of digital-to-analogue converter circuitry, the switch control circuitry may be configured to control the switches in dependence upon a digital signal. In the case of analogue-to-digital converter circuitry, that circuitry may comprise such digital-to-analogue converter circuitry. In such cases, each segment capacitor may correspond to a bit of the digital signal (the input word or code).

According to an embodiment of a third aspect of the present invention, there is provided analogue-to-digital converter circuitry, comprising: an analogue input terminal, operable to receive an analogue input voltage signal; a comparator having first and second comparator-input terminals and operable to generate a comparison result based on a potential difference applied across those terminals; and successive-approximation control circuitry configured to apply a potential difference across the first and second comparator-input terminals based upon the input voltage signal, and configured to control the potential difference for each of a series of successive approximation operations (through charge redistribution), the control applied in each successive approximation operation being dependent on a comparison result generated by the comparator in the preceding approximation operation, wherein: the successive-approximation control circuitry comprises the controllable voltage-signal generation circuitry of the aforementioned first aspect of the present invention; and the switch control circuitry is configured to control the switches in each successive approximation operation in dependence upon the comparison result generated by the comparator in the preceding approximation operation.

For each of at least two of the segment nodes, at least two or three said segment capacitors may be connected at their first terminals to that segment node and at their second terminals to corresponding said switches, the capacitances of those segment capacitors being binary-weighted relative to one another. Further, the reference voltage sources may be configured so that a non-binary search is performed by the series of successive approximation operations, the search being non-binary in that across the series of successive approximation operations the search or search range from one approximation operation to the next in at least one instance is weighted between 2:1 and 1:1. The reference voltage sources may be configured so that the non-binary search is non-binary in that across the series of successive approximation operations the search or search range from one approximation operation to the next in at least one instance is weighted $(1/\sqrt{2}):1$.

According to an embodiment of a fourth aspect of the present invention, there is provided integrated circuitry, such as an IC chip, comprising the controllable voltage-signal generation circuitry of the aforementioned first aspect of the present invention, or the digital-to-analogue converter circuitry or analogue-to-digital converter circuitry of the aforementioned second aspect of the present invention, or the analogue-to-digital converter circuitry of the aforementioned third aspect of the present invention.

The present disclosure extends to method aspects corresponding to the apparatus (circuitry) aspects.

Reference will now be made, by way of example, to the accompanying drawings, of which:

FIG. 1, considered above, is a schematic diagram of overall analogue-to-digital circuitry to which the present invention may be applied;

FIG. 2, considered above, is a schematic diagram useful for understanding the principle of operation of ADC banks of FIG. 1;

FIG. 3, considered above, is a schematic diagram useful for understanding a possible application of SAR-ADC circuitry within each sub-ADC unit of the FIG. 1 circuitry;

FIG. 4, considered above, presents example SAR ADC circuitry which may be employed with the circuitry of FIGS. 1 and 2;

FIG. 5A, considered above, is a schematic diagram of example SAR ADC circuitry previously-considered by the present inventors;

FIG. 5B, considered above, is a graph useful for understanding FIG. 5A;

FIG. 8A is a schematic diagram of controllable voltage-signal generation circuitry useful for understanding the present invention;

Figure 1:
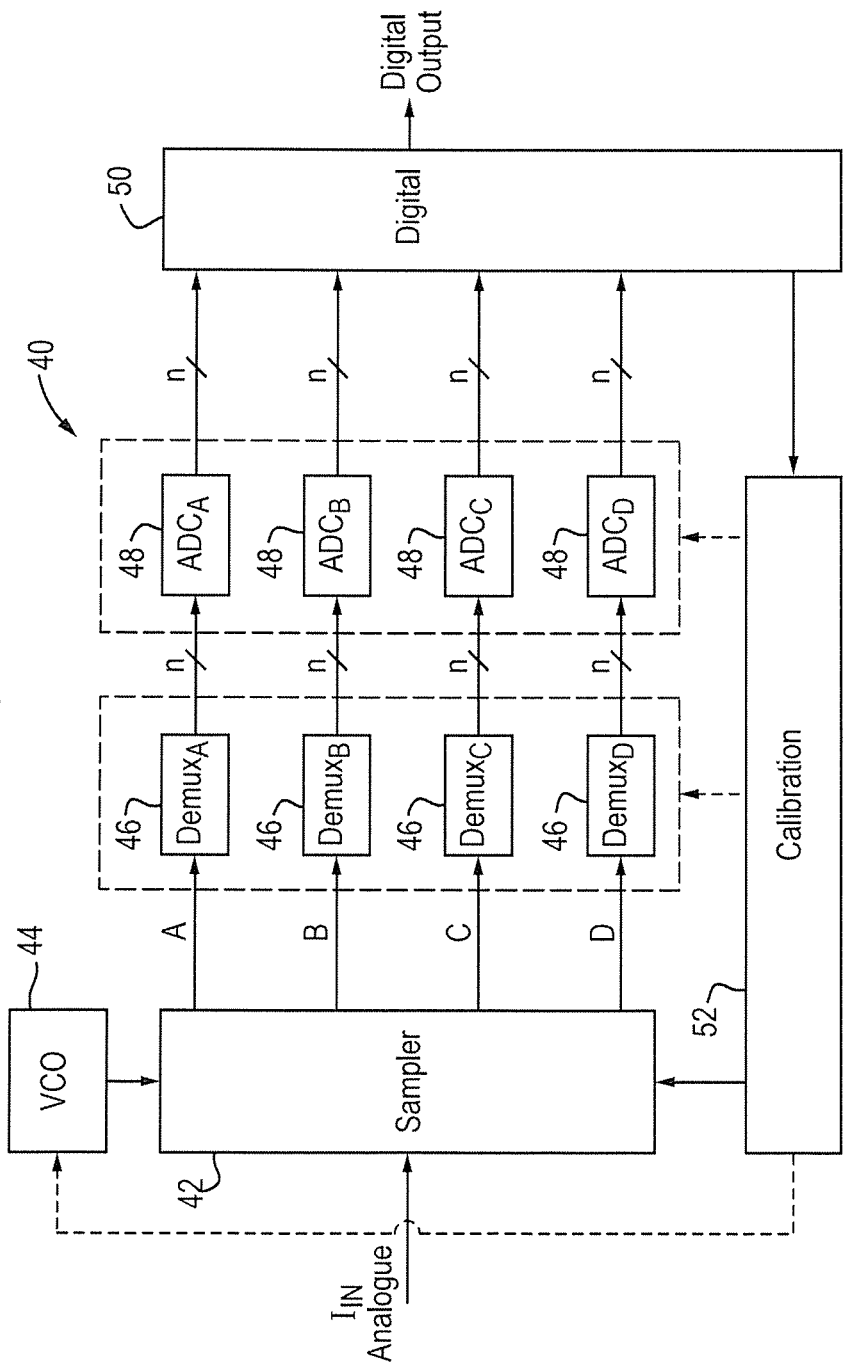
Figure 2:
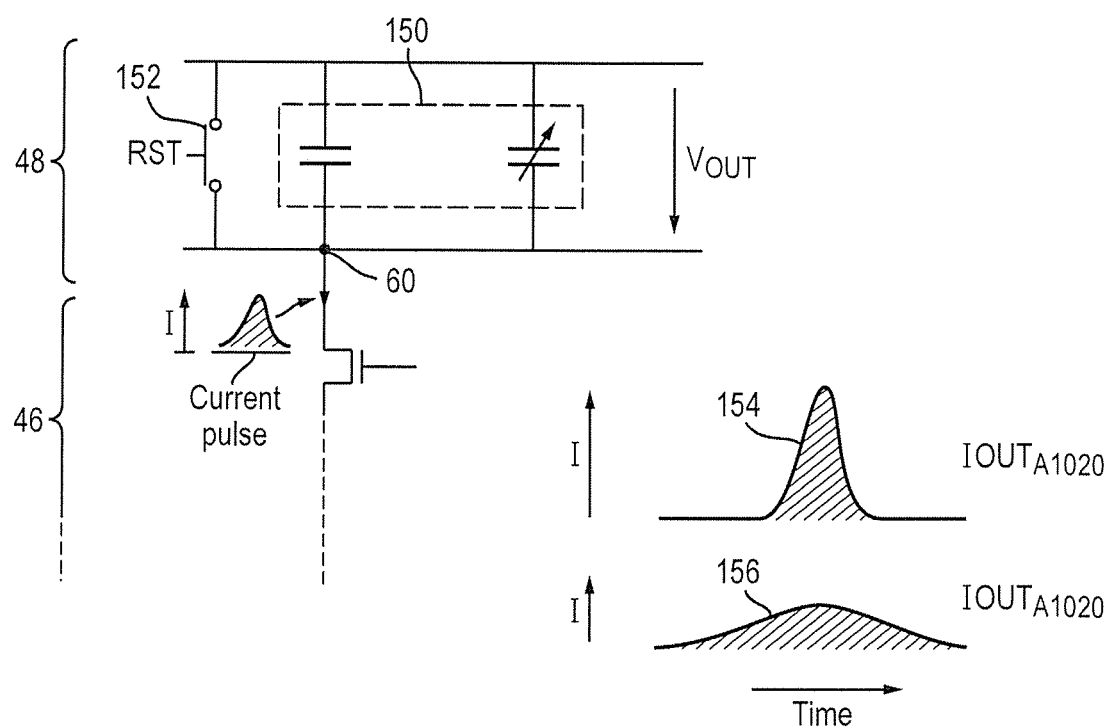
Figure 3:
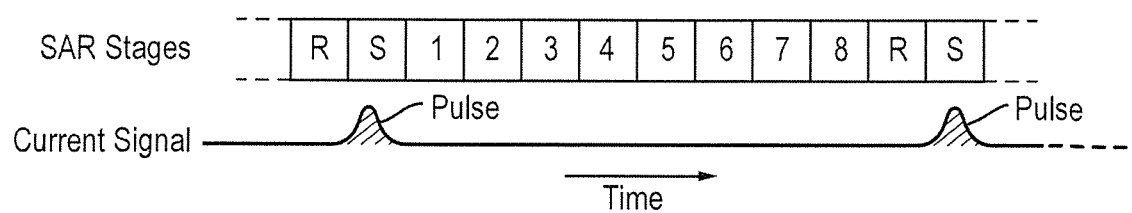
Figure 4:
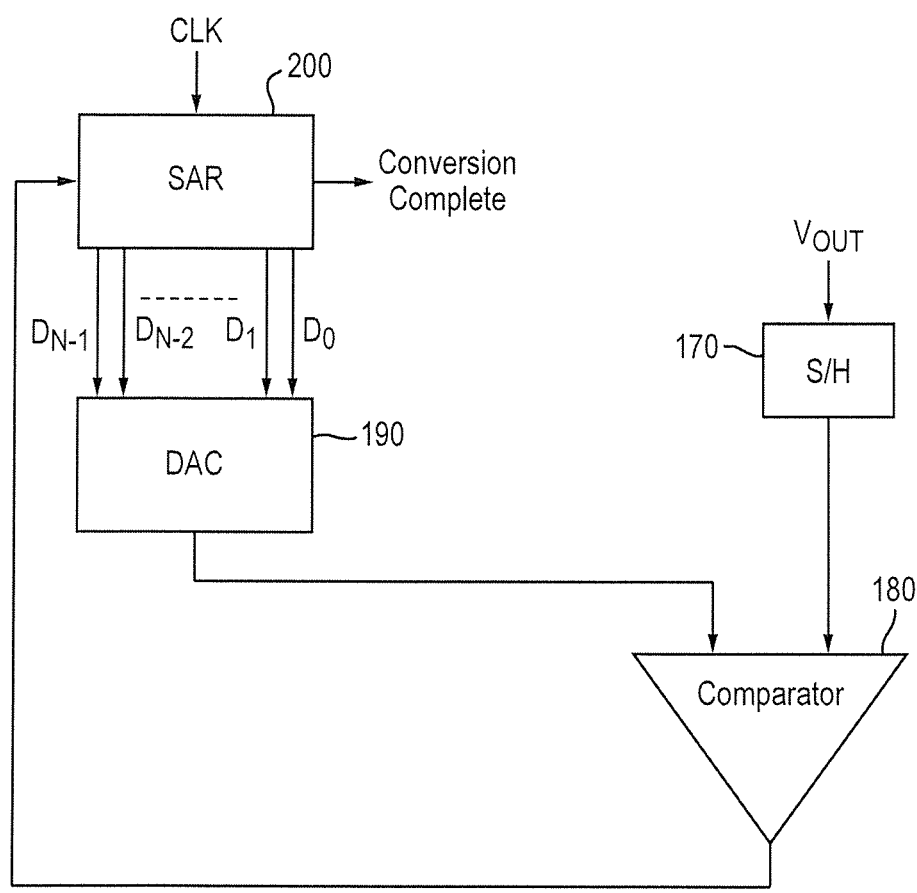
Figure 5A:
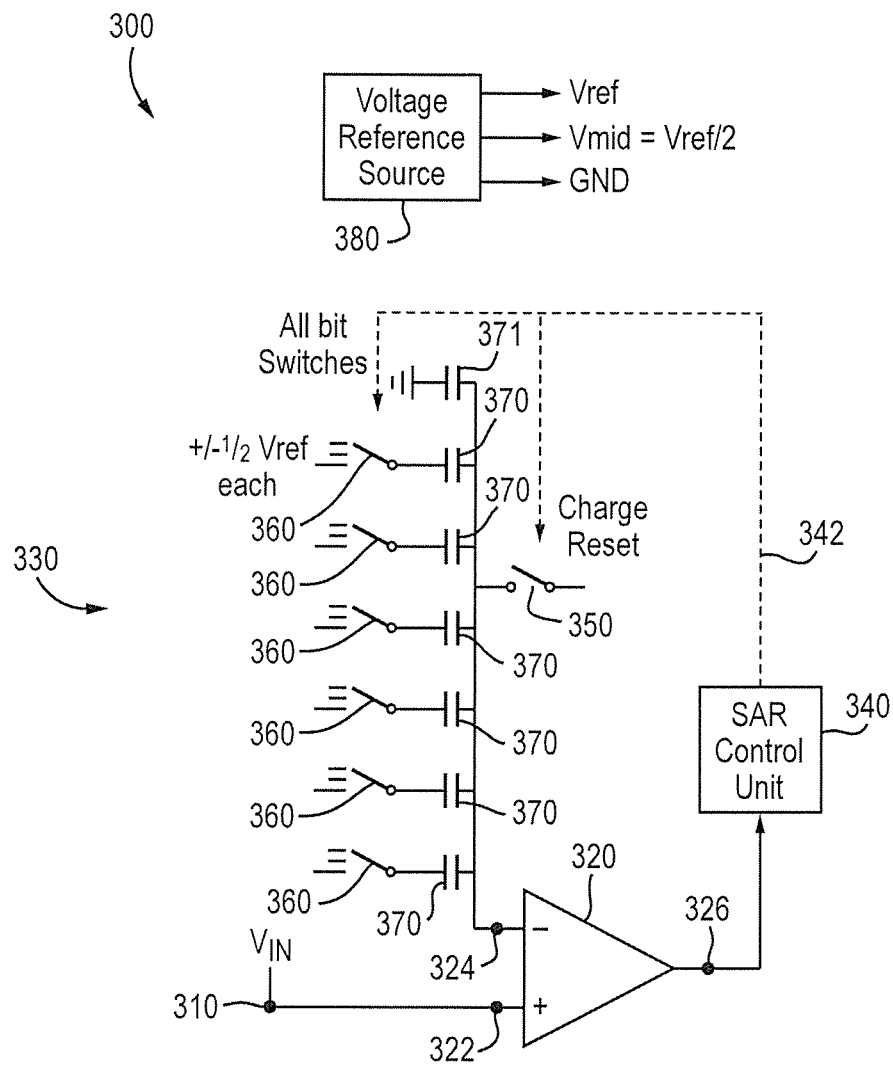
Figure 6:
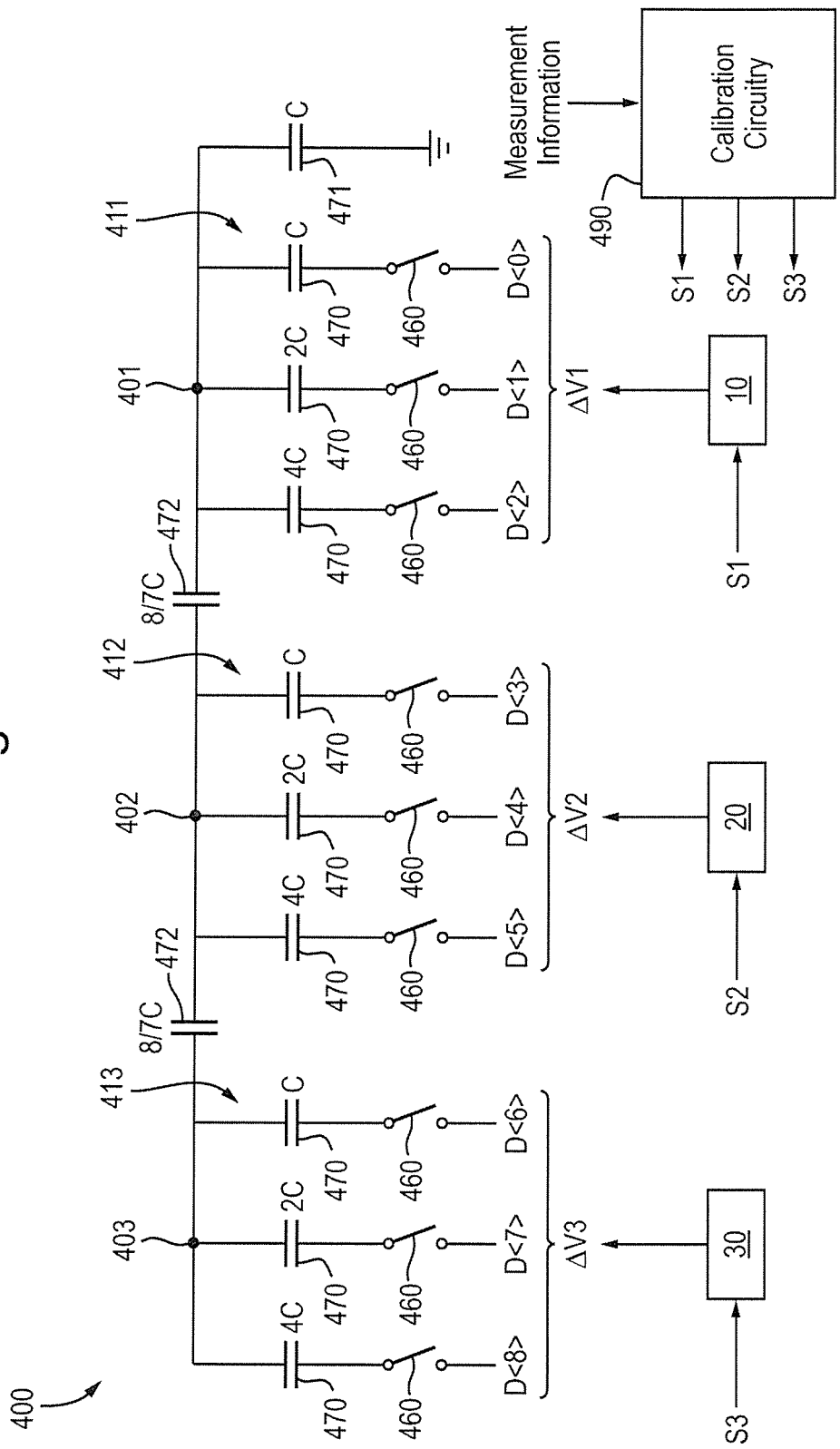
FIG. 6 is a schematic diagram of controllable voltage-signal generation circuitry.

FIG. 6 is a schematic diagram of controllable voltage-signal generation circuitry 400 according to the present invention. The controllable voltage-signal generation circuitry 400 shown in FIG. 6 could be implemented in a SAR ADC (for example it could replace the capacitors 370 and 371 and switches 360 in FIG. 5A, and the node 403 could be connected to the comparator-input terminal 324).

Controllable voltage-signal generation circuitry 400 comprises a plurality of segment nodes 401, 402 and 403, a plurality of segment capacitors 470, an (optional) end capacitor 471, a plurality of switches 460, a plurality of coupling capacitors 472 and voltage sources 10, 20 and 30.

The controllable voltage-signal generation circuitry 400 shown in FIG. 6 also comprises calibration circuitry 490. However calibration circuitry 490 is not essential and in implementations other than the one shown in FIG. 6 controllable voltage-signal generation circuitry 400 does not comprise calibration circuitry 490.

Segment nodes 401, 402 and 403 are connected together in series. Each adjacent pair of segment nodes 401, 402 and 403 are connected together via a corresponding coupling capacitor 472. Segment node 403 serves as an output node. The segment capacitors 470 are grouped into segments 411, 412 and 413, with three segment capacitors 470 per segment. Segment nodes 401, 402 and 403 correspond respectively to segments 411, 412 and 413, and voltage sources 10, 20 and 30 correspond respectively to segments 411, 412 and 413.

Each segment capacitor 470 comprises first and second terminals. The first terminal of each segment capacitor 470 is connected to the segment node 401, 402 and 403 corresponding to the segment 411, 412 and 413 to which that segment capacitor belongs. The second terminal of each segment capacitor 470 is connected to the voltage source 10, 20 and 30 corresponding to the segment 411, 412 and 413 to which that segment capacitor 470 belongs. The second terminal of each segment capacitor 470 is connected to the corresponding voltage source 10, 20 and 30 via a switch 460.

The end capacitor 471 comprises first and second terminals, the first terminal connected to the segment node 401 and the second terminal connected to ground (GND), as an example voltage source. The controllable voltage-signal generation circuitry 400 may not comprise the end capacitor 471. As above, omitting the end capacitor 471 adjusts the step boundaries (i.e. the voltage steps caused by switching the switches 460).

The pairs of segment capacitors 470 and switches 460 are labelled from D<0> to D<8>. Such labelling can aid understanding in the context of the controllable voltage-signal generation circuitry 400 being used in or as a DAC such as a CDAC (and further in a SAR ADC), where the switches 460 are controlled according to the bits of a binary word such as a binary input word (comprising, in the case of the controllable voltage-signal generation circuitry 400 shown in FIG. 6, 9 bits, i.e. D<0> to D<8>; in that case, segment 413 can be referred to as the MSB (most significant bit) segment and segment 411 can be referred to as the LSB (least significant bit) segment).

The voltage sources 10, 20 and 30 and their connection to the second terminals of the segment capacitors 470 via the switch 460 are not shown in detail here. Each voltage source 10, 20 and 30 is operable to supply two or more reference voltages (and thus may be considered to comprise two or more reference voltage sources) so that each switch 460 can be switched to effect a change in the voltage supplied to the second terminal of its corresponding segment capacitor 470. That is, the voltage sources 10, 20 and 30 are operable, in combination with the switches 460 of the corresponding segments 411, 412 and 413, to effect voltage changes ΔV1, ΔV2 and ΔV3, respectively. The voltage sources 10, 20 and 30 and their connection to the second terminals of the segment capacitors 470 via the switch 460 are described in more detail below with reference to FIG. 7.

The controllable voltage-signal generation circuitry 400 shown in FIG. 6 is segmented using the coupling capacitors 472 to scale the relative contribution (to the voltage at the output node 403) provided by each segment 411, 412 and 413. The segment capacitors 470 in each segment 411, 412 and 413 have values so that their relative contribution (to the voltage at the output node 403) is scaled. In FIG. 6, each segment 411, 412 and 413 comprises three segment capacitors 470 with respective capacitances of C, 2C and 4C, and the coupling capacitors 472 each have a capacitance of 8/7 C. These example values are chosen so that, if all the switches 460 connect the second terminals of each segment capacitor to the same voltages (i.e. are configured to effect the same voltage change $\Delta V$), the contribution to the voltage at the output node 403 is equivalent to or the same as would be the case were the segment capacitors 470 starting from the left and moving right across FIG. 6 to have respective capacitances of 256C, 128C, 64C, 32C, 16C, 8C, 4C, 2C and C (i.e. binary weighted), with the coupling capacitors 472 omitted (i.e. shorting nodes 401, 402, 403 together).

It will be appreciated that other values may be chosen for the capacitances of the segment capacitors 470, the coupling capacitors 472 and the end capacitor 471, depending on the application. For example a non-binary weighting system could be used.

Calibration circuitry 490 is connected to receive measurement information and to output control signals S1, S2 and S3 in order to control the voltage sources 10, 20 and 30, respectively. Calibration circuitry 490 is explained in more detail below.

Figure 7A:
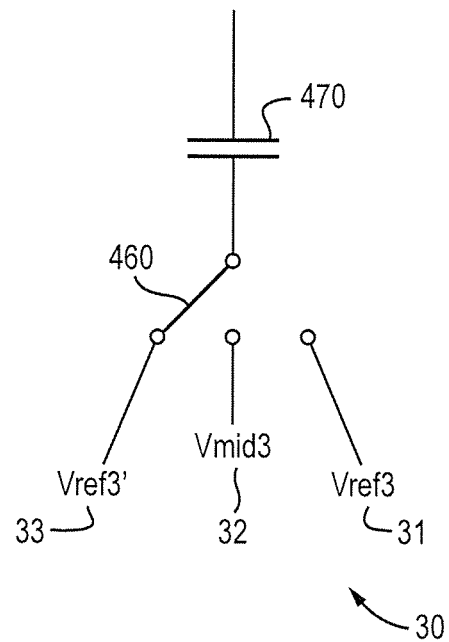
FIGS. 7A and 7B are schematic diagrams of configurations of the reference voltage sources and switches to be implemented in the circuitry of FIG. 6.
Figure 7B:
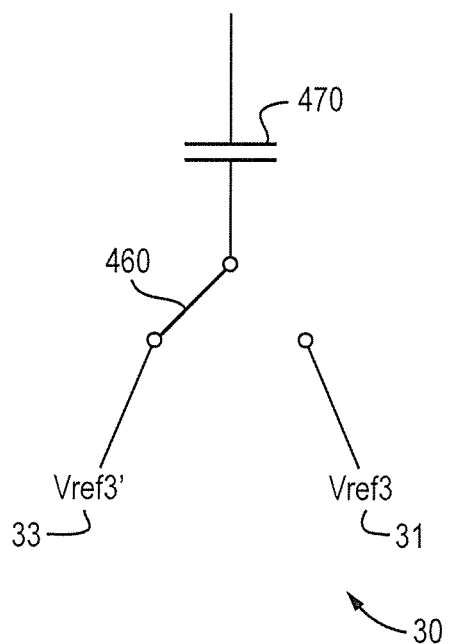

FIGS. 7A and 7B are schematic diagrams showing how the voltage sources 10, 20 and 30 may be connected with the switches 460 in FIG. 6. Only the voltage source 30 is shown, but the other voltage sources 10 and 20 may be connected in the same basic way.

FIG. 7A shows an example of the connection between voltage source 30 and a switch 460 in an implementation in which each switch 470 of controllable voltage-signal generation circuitry 400 shown in FIG. 6 is operable to connect the second terminal of its segment capacitor either to a first reference voltage source Vref3', a second reference voltage source Vref3, or another reference voltage source supplying a voltage which is the mid-point between those reference voltage sources, Vmid3 (=½*(Vref3−Vref3'). An implementation of controllable voltage-signal generation circuitry 400 using such a connection between the voltage sources 10, 20 and 30 and the switches 460 could be used in the first implementation described above with reference to FIGS. 5A and 5B (i.e. the implementation in which each switch 360 is configured to switch between for example $V_{ref}$, $V_{mid}$ and GND).

FIG. 7B shows an example of the connection between voltage source 30 and a switch 460 in an implementation in which each switch 470 of controllable voltage-signal generation circuitry 400 shown in FIG. 6 is operable to connect the second terminal of its segment capacitor either to a first reference voltage source Vref3' or a second reference voltage source Vref3. An implementation of controllable voltage-signal generation circuitry 400 using such a connection between the voltage sources 10, 20 and 30 and the switches 460 could be used in the second implementation described above with reference to FIGS. 5A and 5B (i.e. the implementation in which each switch 360 is configured to switch between $V_{ref}$ and GND (and $V_{IN}$, for the purpose of charging the capacitors, although not shown in FIG. 7B).

When the connection between the voltage sources 10, 20 and 30 and the switches 460 shown in FIG. 7A is used in controllable voltage-signal generation circuitry 400 shown in FIG. 6, the voltage change $\Delta V3$ applied by each switch 460 of segment 413 is ½*(Vref3−Vref3'), since each switch 460 of the segment 413 switches the connection of the second terminal of its segment capacitor 470 from Vmid3 to either of Vref3 or Vref3' to effect the voltage change.

Similarly, the voltage change $\Delta V2$ applied by each switch 460 of segment 412 is ½*(Vref2−Vref2') and the voltage change $\Delta V1$ applied by each switch 460 of segment 411 is ½*(Vref1−Vref1').

When the connection between the voltage sources 10, 20 and 30 and the switches 460 shown in FIG. 7B is used in controllable voltage-signal generation circuitry 400 shown in FIG. 6, the voltage change $\Delta V3$ is (Vref3−Vref3'), since each switch of the segment 413 switches the connection of the second terminal of its segment capacitor 470 from Vref3 to Vref3' (or vice versa) to effect the voltage change. Similarly, the voltage change $\Delta V2$ is (Vref2−Vref2') and the voltage change $\Delta V1$ is (Vref1−Vref1').

In some implementations of the connections shown in FIGS. 7A and 7B, one of the reference voltage sources Vref3 and Vref3' and Vmid3 is simply ground (GND). The same considerations apply to the other voltage sources 10 and 20. That is, one of the reference voltage sources Vref1, Vref1' and Vmid1 may be ground (GND), and/or one of the reference voltage sources Vref2, Vref2' and Vmid2 may be ground (GND).

Returning to FIG. 6, the voltage sources 10, 20, and 30 (or at least one of them) may be configured such that the voltage changes $\Delta V1$, $\Delta V2$ and $\Delta V3$ are variable and not necessarily equal to one another. For example, for the voltage change $\Delta V1$ to be variable, at least one of the reference voltage sources Vref1 or Vref1' (and therefore Vmid1 by extension, as the case may be) is variable. The values for the reference voltage sources Vref1, Vref1', Vref2, Vref2', Vref3 and Vref3' may be selected in order to control the relative scaling between segments 411, 412 and 413 of controllable voltage-signal generation circuitry 400. That is, those values may be chosen to compensate for parasitic capacitances and other sources of error/mismatch, as will be described in more detail below.

As is readily apparent from the preceding description and FIGS. 5A to 7B, the reference voltage sources and switches 460 are configured such that for each segment node 401, 402 and 403 the same voltage change $\Delta V1$, $\Delta V2$ and $\Delta V3$ in magnitude is applied by each switch 460 of that segment node 401, 402 and 403. The reference voltage sources 10, 20 and 30 and switches 460 are configured such that also, for each segment node 401, 402 and 403, the voltage change $\Delta V1$, $\Delta V2$ and $\Delta V3$ applied by each switch 460 of one segment node 401, 402 and 403 is different in magnitude from the voltage change $\Delta V1$, $\Delta V2$ and $\Delta V3$ applied by each switch 460 of another segment node 401, 402 and 403.

That is, the voltage changes $\Delta V1$, $\Delta V2$ and $\Delta V3$ may be chosen such that one of them is different whilst all of the others are the same, or so that a number of them are different from a number of others but the same as each other (in magnitude). The voltage changes $\Delta V1$, $\Delta V2$ and $\Delta V3$ may also be chosen so that they are each different in magnitude.

The voltage changes $\Delta V1$, $\Delta V2$ and $\Delta V3$ may be chosen and set before shipping, or may be designed in (so that the voltage sources 10, 20, and 30 are not or need not be variable), or they may be chosen and set during operation of the controllable voltage-signal generation circuitry 400. The voltage changes $\Delta V1$, $\Delta V2$ and $\Delta V3$ may be continually adjusted during operation of the controllable voltage-signal generation circuitry 400. The voltage changes $\Delta V1$, $\Delta V2$ and $\Delta V3$ may be chosen/set/adjusted through a calibration process.

The voltage changes $\Delta V1$, $\Delta V2$ and $\Delta V3$ may be controlled by calibration circuitry 490 shown in FIG. 6. This control, as mentioned above, may be performed before shipping, or during operation (for example it may be performed at startup, continually or at regular intervals during operation). Calibration circuitry 490 may receive measurement information in the form of the voltage levels at one or more segment nodes 401, 402 and 403, and/or in the form of measurement values of effective capacitances at various positions in controllable voltage-signal generation circuitry 400, and/or as other information (e.g. gain/error information) which may be provided based on external measurements.

Calibration circuitry 490 as shown in FIG. 6 is configured to output control signals S1, S2 and S3 in order to control voltage changes ΔV1, ΔV2 and ΔV3, respectively. However calibration circuitry 490 may output more or fewer control signals. For example in other implementations calibration circuitry 490 is configured to output only one control signal to control one or more of the voltage changes ΔV1, ΔV2 and ΔV3, or any number of control signals to control any number of the voltage changes ΔV1, ΔV2 and ΔV3. In other implementations calibration circuitry 490 is configured to output one control signal to control a reference voltage source (e.g. Vref3) and another control signal to control another reference voltage source of the same voltage source 10, 20 and 30 (e.g. Vref3').

The choice of the voltage changes ΔV1, ΔV2 and ΔV3 is explained below.

FIG. 8A is a schematic diagram of controllable voltage-signal generation circuitry 400 useful for understanding the present invention, in particular the choice of the voltage changes ΔV1, ΔV2 and ΔV3. The controllable voltage-signal generation circuitry 400 is shown in FIG. 8A along with a capacitor, Ccomp, 473 to assist in understanding. The capacitor Ccomp 473 represents a parasitic capacitance experienced at the output node 403 of the controllable voltage-signal generation circuitry 400 (when the controllable voltage-signal generation circuitry 400 is implemented as part of a CDAC in successive-approximation control circuitry like the successive-approximation control circuitry 330 of FIG. 5A, the capacitor Ccomp 473 represents a parasitic capacitance at the input of the comparator 320).

The parasitic capacitance represented by Ccomp 473 causes a full-scale gain error as the output of the controllable voltage-signal generation circuitry 400 (i.e. the output at output node 403) gets attenuated by the parasitic capacitance represented by Ccomp 473. That is, the parasitic capacitance represented by Ccomp 473 results in a voltage division occurring between the effective capacitance of the controllable voltage-signal generation circuitry 400 and Ccomp 473. This full-scale gain error causes a drop in the overall resolution of for example a CDAC in which the controllable voltage-signal generation circuitry 400 is implemented, as full-scale signal level drops (i.e. there is an overall drop in SNR (signal-to-noise ratio)). The full-scale gain error caused by the parasitic capacitance represented by Ccomp 473 can be corrected for (i.e. cancelled out at least partially, or minimised) by adjusting the voltage change ΔV3 applied to the second terminals of the segment capacitors 470 of segment 403 by the corresponding respective switches 460 (that is, by adjusting the voltage change corresponding to the output node 403).

Since the variability of the voltage change ΔV3 in particular is being illustrated in FIG. 8A, only the voltage change ΔV3, and only the voltage source 30, are shown, and the other voltage sources 10 and 20 and the other voltage changes ΔV1 and ΔV2 are not shown, for simplicity. The voltage source 30 is illustrated as a variable voltage source to indicate that the voltage change ΔV3 can be varied in this running example. Of course, the voltage sources 10, 20 and 30 and the switches 460 are configured as described with reference to FIGS. 7A and 7B, with one or more of the reference voltage sources Vref3, Vref3' and Vmid3 being variable in order to effect the voltage change ΔV3, but the voltage source 30 is illustrated in a simpler form in FIG. 8A to aid overall understanding.

As mentioned above, the voltage change ΔV3 may be controlled/adjusted in order to mitigate the effects of the parasitic capacitance represented by Ccomp 473 at the output node 403. For example, if the values of the segment capacitors 470, the end capacitor 471 and the coupling capacitors 472 shown in FIG. 8A are used, then the effective capacitance $C_{eff}$ looking into the controllable voltage-signal generation circuitry 400 from the output node 403 is 8C. If, for example, the unit capacitance represented by C is taken to be 12.5 fF, then the effective capacitance $C_{eff}$ is 100 fF. The parasitic capacitance represented by Ccomp 473 can be estimated in this example to be 40 fF (this value could for example be calculated/measured by calibration circuitry 490, or calibration circuitry 490 may make small corrections iteratively to gradually cancel out this parasitic capacitance), meaning that the overall transfer function of the controllable voltage-signal generation circuitry 400 is attenuated due to this parasitic capacitance by 40%. Therefore in order to compensate for the 40% attenuation a 40% increase in the voltage change ΔV3 is required (for example in order to maintain a ±250 mV peak-to-peak output (at the output node 403) the voltage change ΔV3 should be increased in magnitude to 350 mV). As explained below, the voltage changes ΔV1 and ΔV2 may be adjusted together with the voltage change ΔV3.

As mentioned above, the control of the voltage change ΔV3 may be performed by calibration circuitry 490, or may be performed by other circuitry not comprised within controllable voltage-signal generation circuitry 400.

Figure 8B:
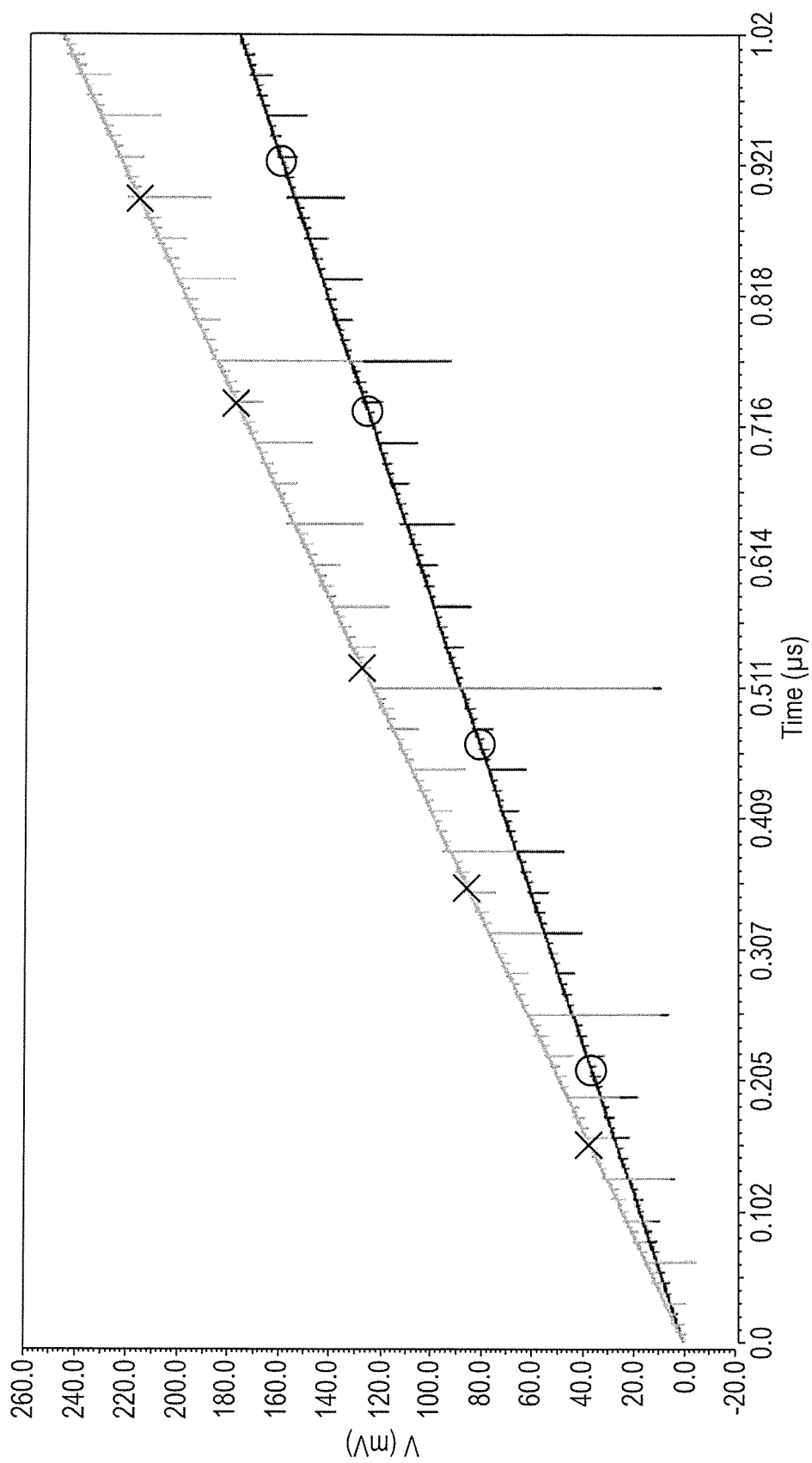
FIG. 8B is a transfer function graph useful for understanding the present invention.

FIG. 8B is a graph illustrating the transfer function of a 9-bit CDAC comprising the controllable voltage-signal generation circuitry 400 when the voltage changes ΔV1, ΔV2 and ΔV3 are all set to 250 mV (the circles in FIG. 8B) and when the voltage changes ΔV1, ΔV2 and ΔV3 are all set to 350 mV (the crosses in FIG. 9B). The peak-to-peak output (at the output node 403) is roughly 175 mV in the case that the voltage changes ΔV1, ΔV2 and ΔV3 are all set to 250 mV due to the parasitic capacitance represented by Ccomp 473. The peak-to-peak output (at the output node 403) is roughly 246 mV in the case that the voltage changes ΔV1, ΔV2 and ΔV3 are all set to 350 mV in order to compensate for the parasitic capacitance represented by Ccomp 473. In this example all of the voltage changes ΔV1, ΔV2 and ΔV3 have been changed, but in other implementations only the voltage change ΔV3 is changed. Also, in other implementations some but not all of the voltage changes other than the voltage change corresponding to the output node 403 (i.e. the voltage change ΔV3) may be changed together with the voltage change corresponding to the output node 403.

Figure 9:
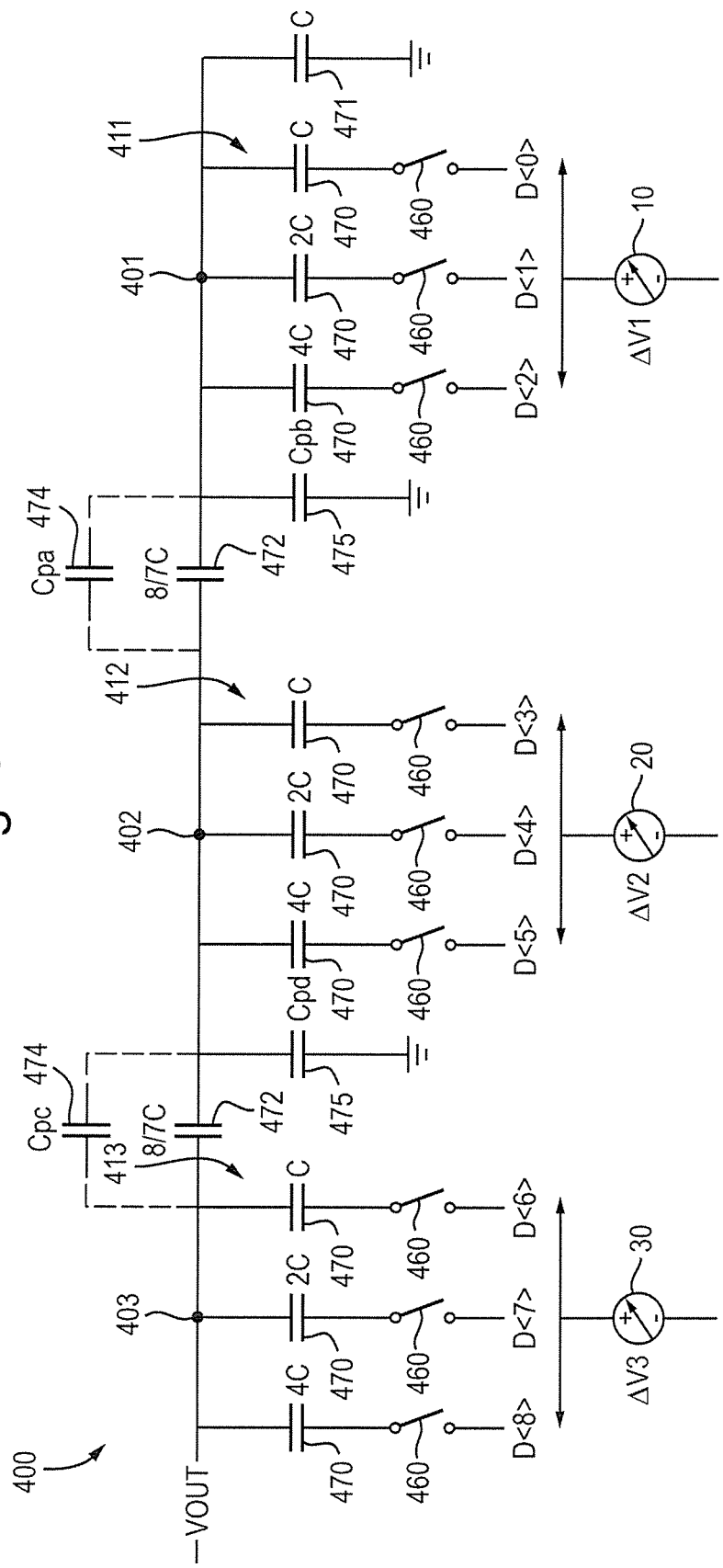
FIG. 9 is a schematic diagram of controllable voltage-signal generation circuitry useful for understanding the present invention.

FIG. 9 is a schematic diagram of controllable voltage-signal generation circuitry 400 useful for understanding the present invention, in particular the choice of the voltage changes ΔV1, ΔV2 and ΔV3. The controllable voltage-signal generation circuitry 400 is shown in FIG. 9 along with capacitors Cpa and Cpc 474 which represent parasitic capacitances across the coupling capacitors 472 (top and bottom plate parasitic capacitances across the coupling capacitors 472, and between any metal routing around the coupling capacitors 472). The controllable voltage-signal generation circuitry 400 is also shown in FIG. 9 along with capacitors Cpb and Cpd 475 which represent parasitic capacitances to the substrate across the coupling capacitors 472 (i.e. between the coupling capacitors 472 and ground).

The parasitic capacitances represented by capacitors Cpa and Cpc effectively increase the capacitances of the coupling capacitors 474, thereby decreasing the weights of individual segments (the segments 411 and 412—i.e. segments other than the segment 413 corresponding to the output node 403). The parasitic capacitances represented by capacitors Cpb and Cpd further attenuate the weights of individual segments (the segments 411 and 412—i.e. segments other than the segment 413 corresponding to the output node 403) as these parasitic capacitances are seen in parallel to the segment capacitors 470. To aid understanding, it is noted that the segment 413 corresponding to the output node 403 is loaded by subsequent segments (i.e. the other segments 411 and 412).

The parasitic capacitances represented by Cpa, Cpb, Cpc and Cpd 474 and 475 cause non-linearities or non-linearity errors (across the transfer characteristics of the CDAC implementation of controllable voltage-signal generation circuitry 400) such as DNL (differential non-linearity) errors and INL (integral non-linearity) errors as they change the weighting of segment capacitors 470 compared to segment capacitors 470 of other segments. The DNL and INL errors result in the degradation of the SNR (signal-to-noise ratio) which in turn degrades the ENOB (effective number of bits) of for example a CDAC in which the controllable voltage-signal generation circuitry 400 is implemented. The parasitic capacitances represented by capacitors Cpa, Cpb, Cpc and Cpd 474 and 475 can be corrected for (i.e. cancelled out at least partially, or minimised) by adjusting either or both of the voltage changes $\Delta V1$ and $\Delta V2$ (applied to the second terminals of the segment capacitors 470 of segments 401 and 402 by the corresponding respective switches 460) relatively to each other and the voltage change $\Delta V3$ (that is, by adjusting the voltage change corresponding to one or more of the segment nodes 401 and 402 other than the output node 403, relatively to each other and to the voltage change $\Delta V3$ corresponding to the output node 403).

The variability of the voltage changes $\Delta V1$ and $\Delta V2$ is being illustrated in FIG. 9 in particular, however the other voltage source 30 and the other voltage change $\Delta V3$ are shown, for completeness (the voltage change $\Delta V3$ may have been previously adjusted to first calibrate out a gain error for example). The voltage sources 10 and 20 are illustrated as variable voltage sources to indicate that the voltage changes $\Delta V1$ and $\Delta V2$ can be varied in this running example. Of course, the voltage sources 10, 20 and 30 and the switches 460 are configured as described with reference to FIGS. 7A and 7B, with one or more of the reference voltage sources Vref1, Vref1' and Vmid1 being variable in order to effect the voltage change $\Delta V1$, and one or more of the reference voltage sources Vref2, Vref2' and Vmid2 being variable in order to effect the voltage change $\Delta V2$, but the voltage sources 10 and 20 are illustrated in a simpler form in FIG. 9 to aid overall understanding. Here, changes in the voltage changes $\Delta V1$ and $\Delta V2$ are relative to the voltage change $\Delta V3$ (for example, when considering the charge lost due to parasitic capacitance (charge=voltage*capacitance), if $\Delta V3=k$, then for example $\Delta V2$ should be adjusted so that $\Delta V2=(1+d)*k$, where d represents how much adjustment, relative to $\Delta V3$, is required).

Generally, in order to mitigate the effects of parasitic capacitances, the voltage changes will get successively larger moving from the MSB segment down to the LSB segment. For example, $\Delta V1 > \Delta V2 > \Delta V3$.

As mentioned above, one or more of the voltage changes $\Delta V1$ and $\Delta V2$ may be controlled/adjusted in order to mitigate the effects of the parasitic capacitances represented by capacitors Cpa, Cpb, Cpc and Cpd 474 and 475. That is, one or more of the voltage changes $\Delta V1$ and $\Delta V2$ may be changed relatively to the voltage change $\Delta V3$ (and also relatively to each other) in order to adjust the effective weighting of segment capacitors 470 of one or more of the segments 411 and 412 corresponding to the voltage changes $\Delta V1$ and $\Delta V2$ relatively to segment capacitors 470 of the segment 413 corresponding to the voltage change $\Delta V3$ and to the output node 403 (and also relatively to segment capacitors 470 of the other segments 411 and 412).

The parasitic capacitances described above with reference to FIGS. 8 and 9 are merely examples of the kind of parasitic capacitances that can be corrected for in the controllable voltage-signal generation circuitry 400. Of course, by varying one or more of the voltage changes $\Delta V1$, $\Delta V2$ and $\Delta V3$, any parasitic capacitances can be corrected for (e.g. through trial and error or through calculation of the parasitic capacitance), for example systematic layout parasitics which occur between segments 411, 412 and 413. In some implementations the voltage changes $\Delta V1$ and $\Delta V2$ are controlled to be changed by the same amount so that they are equal (in magnitude) to each other (this for example ignores particular systematic and layout parasitic capacitances).

As an example operation of calibration, in order to set the correct gain of controllable voltage-signal generation circuitry 400, the switches 460 may be switched so that they correspond to an input word (a code) consisting entirely of zeroes (i.e. full scale in one direction, so that D<0> to D<8> are all logic 0) and the voltage level at the output node 403 measured, and then the switches 460 may be switched so that they correspond to an input word consisting entirely of ones (i.e. full scale in the other direction, so that D<0> to D<8> are all logic 1) and the voltage level at the output node 403 measured again. The difference between these two voltage levels (i.e. the voltage swing of controllable voltage-signal generation circuitry 400) may be compared against a preferred or reference voltage swing value and one or more of the voltage changes $\Delta V1$, $\Delta V2$ and $\Delta V3$ (at least $\Delta V3$) may be adjusted to bring the measured voltage swing to or towards the preferred reference voltage swing value, i.e. to adjust the gain.

Continuing the running example operation of calibration, the switches 460 may be switched in a manner so that, effectively, all possible "codes" are supplied to the controllable voltage-signal generation circuitry 400, successively (i.e. the switches 460 may be operated so that the voltage level at the output node 403 increases successively with each successive operation of the switches 460, i.e. from full scale in one direction to full scale in the other). The voltage level at the output node 403 may then be measured after each switch operation. Such an operation may be referred to as a "code sweep". One or more of the voltage changes $\Delta V1$, $\Delta V2$ and $\Delta V3$ (in particular $\Delta V1$ and/or $\Delta V2$) may be adjusted (e.g. to calibrate out non-linearities corresponding to Cpa, Cpb, Cpc and Cpd in FIG. 9) and the code sweep repeated in order to determine whether the adjustment has had the desired effect.

In a particular implementation, only the voltage change $\Delta V3$ is adjusted during a first stage in which the gain of controllable voltage-signal generation circuitry 400 is calibrated. Then the voltage changes $\Delta V1$ and $\Delta V2$ are adjusted during a second stage (calibration to mitigate non-linearity errors). In another implementation, the voltage changes $\Delta V1$ and $\Delta V2$ may be adjusted together with $\Delta V3$ in the first stage. Of course, in other implementations the first and second stages may be performed in a different order, and repeated successively until a desired performance is achieved.

Figure 10A:
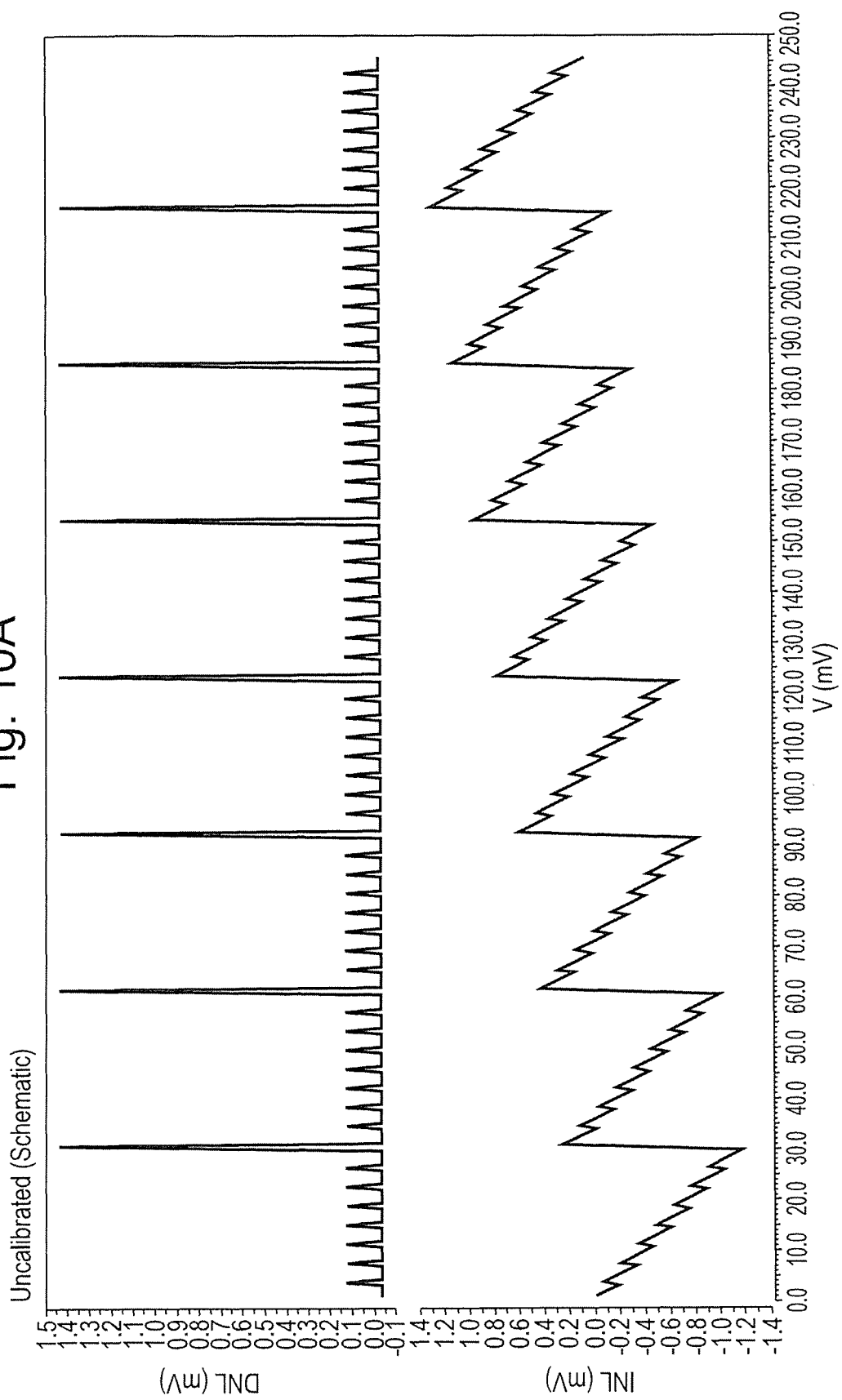
FIGS. 10A and 10B are DNL (differential non-linearity) and INL (integral non-linearity) graphs useful for understanding the present invention.
Figure 10B:
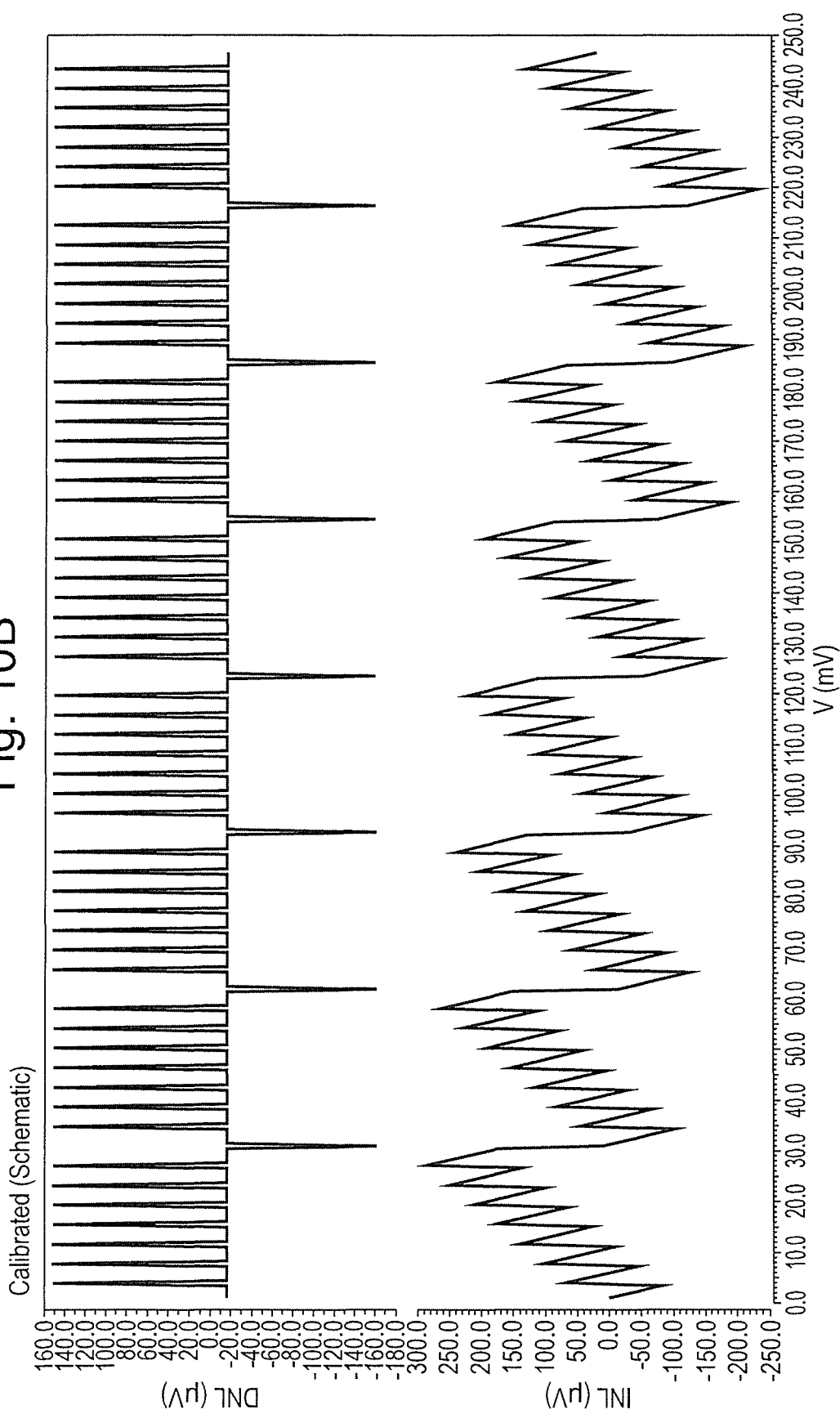

FIG. 10A shows graphs representing the DNL and the INL for an implementation of controllable voltage-signal generation circuitry 400 in which each of the voltage changes $\Delta V1$, $\Delta V2$ and $\Delta V3$ is equal in magnitude to 350 mV. FIG. 10B shows graphs representing the DNL and the INL for an implementation of controllable voltage-signal generation circuitry 400 in which the voltage change $\Delta V3$ is equal in magnitude to 350 mV and each of the voltage changes $\Delta V1$ and $\Delta V2$ is equal in magnitude to 359 mV. It can be seen from these graphs that the DNL and INL are smaller in magnitude when the voltage changes $\Delta V1$ and $\Delta V2$ have been adjusted to mitigate the effects of parasitic capacitances. The graphs shown in FIGS. 10A and 10B have been generated based on schematic simulations of the controllable voltage-signal generation circuitry 400. In such schematic simulations is it assumed that the connections between components are ideal (i.e. contribute no parasitic capacitance) and that the only parasitic capacitance is associated with the components themselves. In practice, of course, there are additional parasitic capacitances (layout-dependent parasitic capacitances).

Figure 11A:
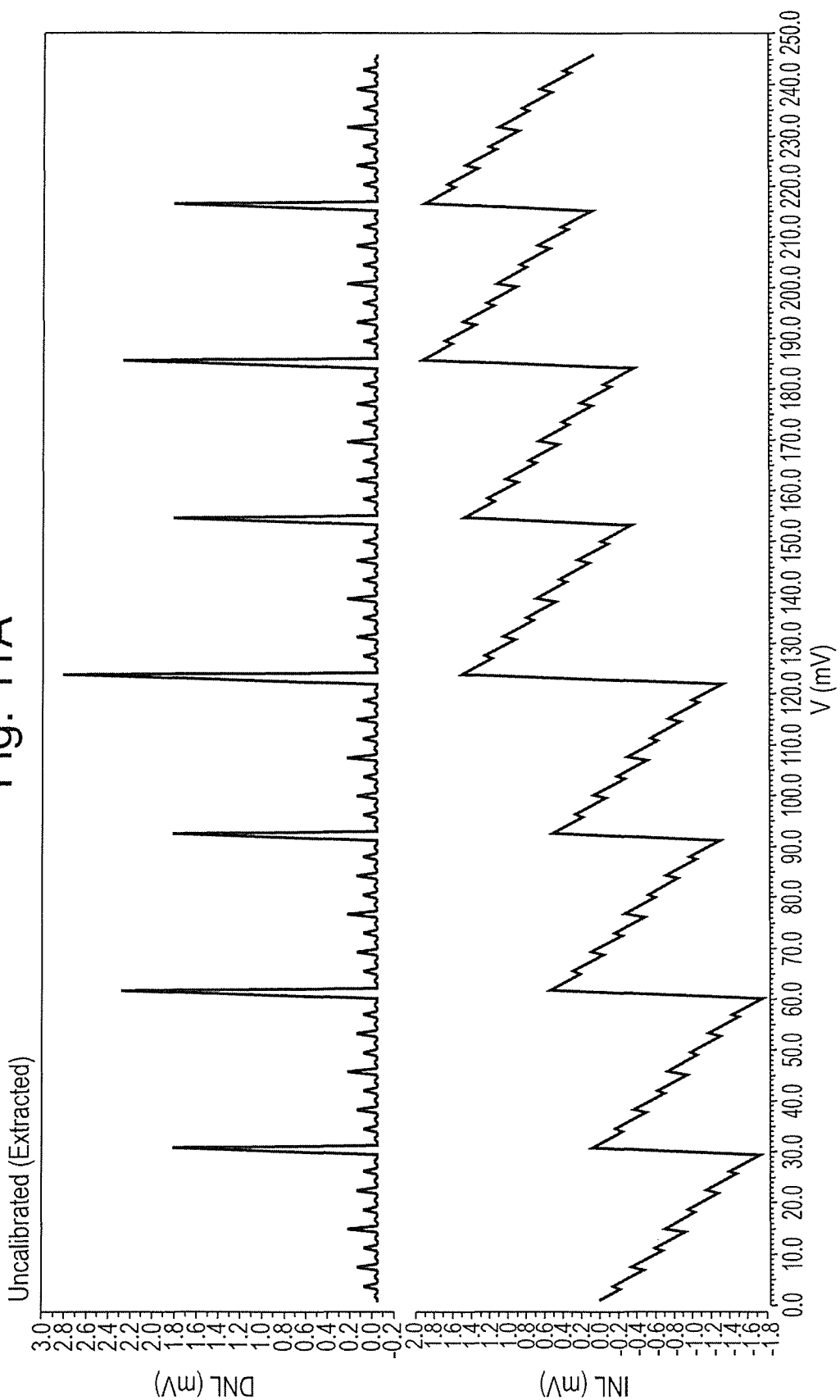
FIGS. 11A and 11B are DNL (differential non-linearity) and INL (integral non-linearity) graphs useful for understanding the present invention.
Figure 11B:
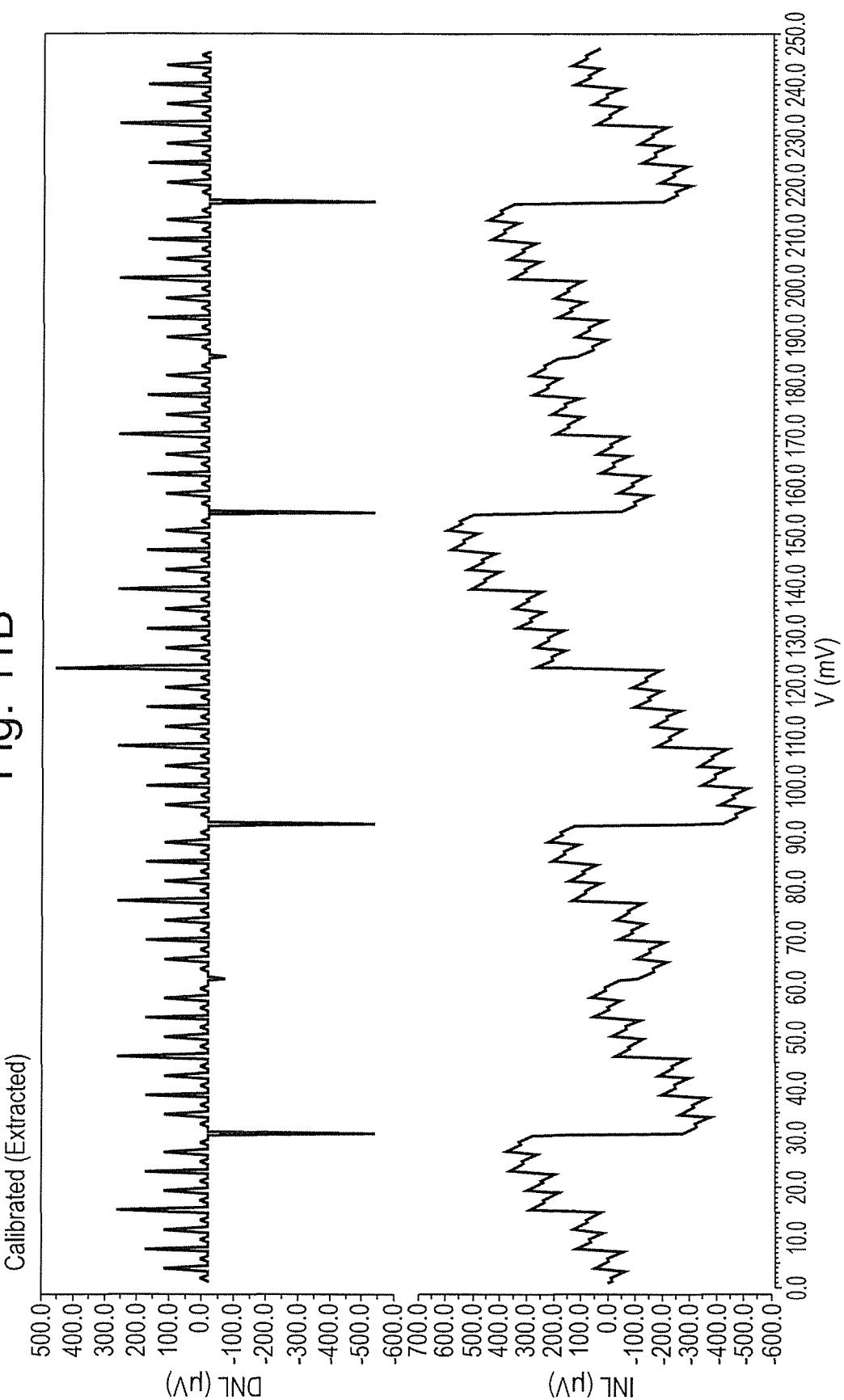

FIG. 11A shows graphs representing the DNL and the INL for an implementation of controllable voltage-signal generation circuitry 400 in which each of the voltage changes $\Delta V1$, $\Delta V2$ and $\Delta V3$ is equal in magnitude to 350 mV. FIG. 11B shows graphs representing the DNL and the INL for an implementation of controllable voltage-signal generation circuitry 400 in which the voltage change $\Delta V3$ is equal in magnitude to 350 mV and each of the voltage changes $\Delta V1$ and $\Delta V2$ is equal in magnitude to 363.5 mV. It can be seen from these graphs that the DNL and INL are smaller in magnitude when the voltage changes $\Delta V1$ and $\Delta V2$ have been adjusted to mitigate the effects of parasitic capacitances. The graphs shown in FIGS. 11A and 11B have been generated based on extracted simulations of the controllable voltage-signal generation circuitry 400. In such extracted simulations, parasitic capacitances due to the layout of the circuitry are also included (i.e. the extracted simulations include the parasitic capacitances associated with the components themselves and also the parasitic capacitances due to the interconnections, for example).

Aside from the calibration and correction for parasitic capacitances described above, there are other additional benefits to the controllable voltage-signal generation circuitry 400.

For example, when the controllable voltage-signal generation circuitry 400 is implemented as part of a CDAC, it is capable of both binary and non-binary conversion. For instance, in a binary implementation the controllable voltage-signal generation circuitry 400 is implemented with the capacitance values for the segment capacitors 470 as shown in FIG. 6, and the voltage changes $\Delta V1$, $\Delta V2$ and $\Delta V3$ could be controlled (taking account of parasitic capacitances) so that the effective relative weights of each segment capacitor 470 as viewed from the output node 403 are (exactly), starting from the left of FIG. 6 and moving to the right, 256C, 128C, 64C, 32C, 16C, 8C, 4C, 2C and C. That is, the voltage changes $\Delta V1$, $\Delta V2$ and $\Delta V3$ may be controlled so that the segment capacitors have effectively (exact) binary weighting.

In another, non-binary, implementation the controllable voltage-signal generation circuitry 400 is implemented still with the capacitance values for the segment capacitors 470 as shown in FIG. 6, but the voltage changes $\Delta V1$, $\Delta V2$ and $\Delta V3$ are controlled relative to one another (such as by controlling $\Delta V1$ and/or $\Delta V2$ relative to $\Delta V3$) so that the relative weights of segment capacitors 470 of one segment overlap with (or are shifted relative to, as compared to the binary weighting situation described above) the relative weighs of segment capacitors 470 of another segment. That is, in the case of segment overlap, the voltage changes $\Delta V1$, $\Delta V2$ and $\Delta V3$ are controlled so that for example the right-most segment capacitor 470 of segment 412 has an effective weight as viewed from the output node 403 (taking into account the coupling capacitors 472, any parasitic capacitance and the effect of the voltage changes $\Delta V1$, $\Delta V2$ and $\Delta V3$) less than the effective weight of the middle segment capacitor 470 of segment 411 and more than the right-most segment capacitor 470 of the segment 411. The same considerations apply to other segment capacitors 470. It will be appreciated that the voltage changes $\Delta V1$ and/or $\Delta V2$ can be controlled so that the relative weights of the segment capacitors 470 as viewed from the output node 403 implement a range of different non-binary weighting systems. Here, non-binary may refer to any weighting system in which not every step between successive segment capacitors 470 is binary (non-binary here therefore includes weighting systems in which every such step is non-binary).

Another advantage of the controllable voltage-signal generation circuitry 400 is improved speed. Due to the coupling capacitors 472, the maximum capacitance of a segment capacitor 470 is reduced (e.g. the maximum capacitance of a segment capacitor is 4C in the controllable voltage-signal generation circuitry 400 shown in FIG. 6, but in equivalent circuitry (e.g. suitable for implementation in a 9-bit CDAC) without the coupling capacitors 472 the maximum capacitance of a capacitor would be 512C, which is 128 times larger. Therefore controllable voltage-signal generation circuitry 400 is 128 times quicker to charge. For similar reasons the controllable voltage-signal generation circuitry 400 consumes less power (the switching energy is smaller due to the smaller capacitors). Also significant area reduction can be achieved since smaller capacitors are needed (for example an 83.2% area reduction can be achieved in the 9-bit CDAC comparative example described here). If the capacitors are made up of unit capacitors having "unit" capacitance C, then fewer capacitors would also be needed. Fewer capacitors would also be needed compared to a situation where non-linearities due to parasitic capacitances are compensated for by means of additional capacitor trimming banks (which are not area efficient, since they involve additional capacitors which can be switched in or out).

Another advantage of the controllable voltage-signal generation circuitry 400 is that due to the variable reference voltage sources Vref1, Vref1', Vref2, Vref2', Vref3 and Vref3' (and in some implementations Vmid1, Vmid2 and Vmid3), the restrictions on the capacitance values of the coupling capacitors 472 can be relaxed. For example in the controllable voltage-signal generation circuitry 400 shown in FIG. 6 the coupling capacitors 472 have capacitance values of 8/7 C, as this amount ensures correct or desired weighting between the segments (in other implementations different capacitance values might be required). However the values of the coupling capacitors can be set for example to C, or any reasonable capacitance value, and the voltage changes $\Delta V1$, $\Delta V2$ and $\Delta V3$ can be adjusted to provide the correct relative weighting between segments. It is advantageous to adopt the value C for the coupling capacitors for example so that the capacitors 470 and 472 all have capacitance values which are integer multiples of C (and are thus readily implemented, for example using a common macro).

Another advantage of the controllable voltage-signal generation circuitry 400 is that the restrictions on the switches 460 can be relaxed. In circuitry equivalent to the controllable voltage-signal generation circuitry 400 but without the coupling capacitors 472 the switch size would need to increase/scale to track capacitor sizes from the LSB segment to MSB segment to ensure the same settling time across individual bit transitions of for example a straight binary CDAC in which the circuitry is implemented. Due to the coupling capacitors 472, a uniform switch size can be used for the switches 460 since there is less variation in the size of the segment capacitors 470 (compared to circuitry without the coupling capacitors 472). For example in the 9-bit CDAC implementation described as a running example only 3 distinct capacitor values (C, 2C and 4C), which are very close to each, other are used and therefore using the same switch size for all of the switches 460 has negligible effect on the settling time (i.e. the settling times are all are roughly the same, or the same to within an acceptable range) of the individual transitions across the transfer function of the CDAC in which the circuitry is implemented.

It will be appreciated that since parasitic capacitances can be cancelled out by controlling the voltage changes ΔV1, ΔV2 and ΔV3, there is correspondingly less restriction in the layout and design of circuitry including the controllable voltage-signal generation circuitry 400.

Figure 12:
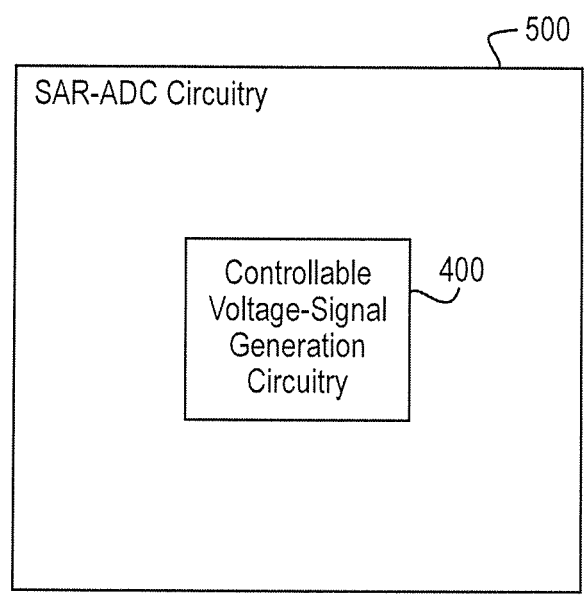
FIG. 12 is a schematic diagram of SAR-ADC circuitry.

FIG. 12 is a schematic diagram of SAR-ADC circuitry 500 comprising the controllable voltage-signal generation circuitry 400. The SAR-ADC circuitry 500 could for example be the circuitry shown in FIG. 5A, with the controllable voltage-signal generation circuitry 400 replacing the capacitors 370 and 371 and switches 360, and the node 403 could be connected to the comparator-input terminal 324.

Figure 13:
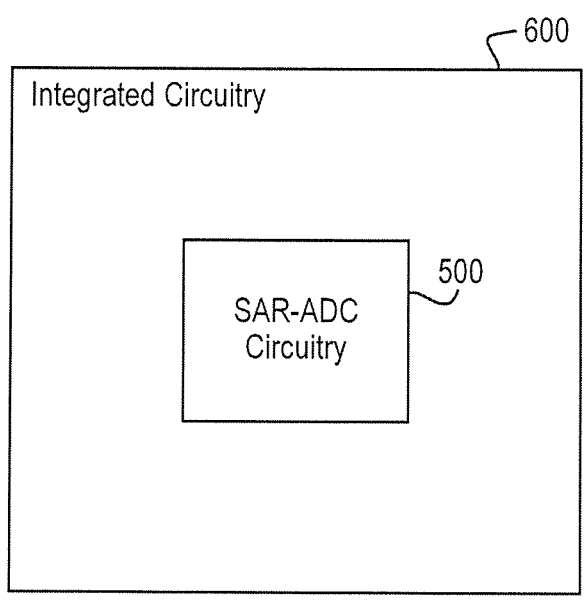
FIG. 13 is a schematic diagram of integrated circuitry.

FIG. 13 is a schematic diagram of integrated circuitry, such as an IC chip, comprising the SAR-ADC circuitry 500.

The present invention extends to integrated circuitry and IC chips as mentioned above, circuit boards comprising such IC chips, and communication networks (for example, internet fiber-optic networks and wireless networks) and network equipment of such networks, comprising such circuit boards.

A 9-bit CDAC implementation of controllable voltage-signal generation circuitry 400 has been used to illustrate many examples herein however it is readily apparent that analogous considerations will apply in an n-bit CDAC. Controllable voltage-signal generation circuitry 400 has been illustrated as comprising three segments, each segment comprising three segment capacitors, however controllable voltage-signal generation circuitry 400 may comprise any number (but at least two) of segments and each segment may comprise any number of segment capacitors.

The circuitry disclosed in for example FIG. 6 may be referred to as a reconfigurable multi-segmented M×N (e.g. M segments, with N bits or segment capacitors per segment, where M and N are integers, M≥2, N≥1, and M and N are both 3 in the specific embodiment of FIG. 6) CDAC with inherent gain & linearity calibration, suitable for use in a SAR ADC.

The present invention may be embodied in many different ways in the light of the above disclosure, within the spirit and scope of the appended claims.

The invention claimed is:

1. Controllable voltage-signal generation circuitry, comprising:
    a plurality of segment nodes connected together in series, each adjacent pair of segment nodes in the series connection being connected together via a corresponding coupling capacitor, an end one of the segment nodes in the series connection serving as an output node;
    for each of the segment nodes, at least one segment capacitor having first and second terminals, the first terminal connected to that segment node and the second terminal connected to a corresponding switch; and
    switch control circuitry,
    wherein:
    each switch is operable to connect the second terminal of its segment capacitor to one reference voltage source and then instead to another reference voltage source, those reference voltage sources having different voltage levels, to apply a voltage change at the second terminal of its segment capacitor;
    the reference voltage sources and switches are configured such that for each segment node the same voltage change in magnitude is applied by each switch of that segment node, and such that the voltage change applied by each switch of one segment node is different in magnitude from the voltage change applied by each switch of another segment node; and
    the switch control circuitry is configured to control the switches so as to control a voltage signal at said output node.

2. The controllable voltage-signal generation circuitry as claimed in claim 1, wherein:
    the plurality of segment nodes comprises at least three segment nodes; and/or
    for each of the segment nodes, at least two or three said segment capacitors are connected at their first terminals to that segment node and at their second terminals to corresponding said switches, the capacitances of those segment capacitors optionally being binary-weighted relative to one another.

3. The controllable voltage-signal generation circuitry as claimed in claim 1, wherein:
    the plurality of segment nodes comprises at least three segment nodes; and
    the reference voltage sources and switches are configured such that, for at least three said segment nodes, the voltage change applied by each switch of any one of those segment nodes is different in magnitude from the voltage change applied by each switch of the other segment nodes of those segment nodes.

4. The controllable voltage-signal generation circuitry as claimed in claim 1, wherein:
    at least one of said reference voltage sources is a variable reference voltage source configured to be adjusted to adjust the voltage change applied by each switch connected to that reference voltage source; and/or
    at least one said reference voltage source connected to each switch is a variable reference voltage source configured to be adjusted to adjust the voltage change applied by each switch concerned.

5. The controllable voltage-signal generation circuitry as claimed in claim 1, comprising:
    calibration circuitry configured to adjust the voltage level of at least one of the reference voltage sources.

6. The controllable voltage-signal generation circuitry as claimed in claim 5, wherein the calibration circuitry is configured to adjust the voltage level of at least one of the reference voltage sources connected to each switch for the segment node serving as the output node so as to adjust the voltage change applied by each switch of that segment node.

7. The controllable voltage-signal generation circuitry as claimed in claim 6, wherein the calibration circuitry is configured to adjust the voltage change applied by each switch of the segment node serving as the output node to calibrate out a gain error of the controllable voltage-signal generation circuitry or to adjust the gain of the controllable voltage-signal generation circuitry.

8. The controllable voltage-signal generation circuitry as claimed in claim 5, wherein the calibration circuitry is configured to adjust the voltage level of at least one of the reference voltage sources connected to each switch for at least one segment node other than the segment node serving as the output node so as to adjust the voltage change applied by each switch of that segment node.

9. The controllable voltage-signal generation circuitry as claimed in claim 8, wherein the reference voltage sources are connected to the switches such that adjusting the voltage level of said at least one of the reference voltage sources connected to each switch for said at least one segment node other than the segment node serving as the output node adjusts the voltage change applied by each switch of that segment node:
independently of the voltage change applied by each switch of each other segment node; and/or
relative to the voltage change applied by each switch of the segment node serving as the output node.

10. The controllable voltage-signal generation circuitry as claimed in claim 8, wherein the calibration circuitry is configured to adjust the voltage change applied by each switch of that segment node to calibrate out non-linearity errors caused by the controllable voltage-signal generation circuitry.

11. The controllable voltage-signal generation circuitry as claimed in claim 8, wherein the calibration circuitry is configured to adjust the voltage change applied by each switch of that segment node to adjust a weighting of the effect of the voltage changes for that segment node relative to a weighting of the effect of the voltage changes for another said segment node.

12. Digital-to-analogue converter circuitry comprising the controllable voltage-signal generation circuitry as claimed in claim 1, wherein the switch control circuitry is configured to control the switches in dependence upon a digital signal.

13. Integrated circuitry, such as an IC chip, comprising the digital-to-analogue converter circuitry as claimed in claim 12.

14. Analogue-to-digital converter circuitry, comprising:
an analogue input terminal, operable to receive an analogue input voltage signal;
a comparator having first and second comparator-input terminals and operable to generate a comparison result based on a potential difference applied across those terminals; and
successive-approximation control circuitry configured to apply a potential difference across the first and second comparator-input terminals based upon the input voltage signal, and configured to control the potential difference for each of a series of successive approximation operations through charge redistribution, the control applied in each successive approximation operation being dependent on a comparison result generated by the comparator in the preceding approximation operation,
wherein:
the successive-approximation control circuitry comprises the controllable voltage-signal generation circuitry as claimed in claim 1; and
the switch control circuitry is configured to control the switches in each successive approximation operation in dependence upon the comparison result generated by the comparator in the preceding approximation operation.

15. The analogue-to-digital converter circuitry as claimed in claim 14, wherein:
for each of at least two of the segment nodes, at least two or three said segment capacitors are connected at their first terminals to that segment node and at their second terminals to corresponding said switches, the capacitances of those segment capacitors being binary-weighted relative to one another; and
the reference voltage sources are configured so that a non-binary search is performed by the series of successive approximation operations, the search being non-binary in that across the series of successive approximation operations the search or search range from one approximation operation to the next in at least one instance is weighted between 2:1 and 1:1.

16. Integrated circuitry, such as an IC chip, comprising the analogue-to-digital converter circuitry as claimed in claim 15.

17. Integrated circuitry, such as an IC chip, comprising the analogue-to-digital converter circuitry as claimed in claim 14.

18. Integrated circuitry, such as an IC chip, comprising the controllable voltage-signal generation circuitry as claimed in claim 1.

* * * * *